(12) United States Patent
Shih et al.

(10) Patent No.: US 11,205,628 B2
(45) Date of Patent: Dec. 21, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/730,390

(22) Filed: Dec. 30, 2019

(65) Prior Publication Data
US 2021/0202412 A1 Jul. 1, 2021

(51) Int. Cl.
*H01L 23/00* (2006.01)
*H01L 21/768* (2006.01)
*H01L 23/528* (2006.01)

(52) U.S. Cl.
CPC ........ *H01L 24/05* (2013.01); *H01L 21/76816* (2013.01); *H01L 21/76831* (2013.01); *H01L 21/76871* (2013.01); *H01L 23/5283* (2013.01); *H01L 24/03* (2013.01); *H01L 2224/02373* (2013.01)

(58) Field of Classification Search
CPC ..... H01L 24/05; H01L 23/5283; H01L 24/03; H01L 21/76831; H01L 21/76871; H01L 21/76816
See application file for complete search history.

(56) References Cited

U.S. PATENT DOCUMENTS

| | | | | |
|---|---|---|---|---|
| 10,147,682 | B2 * | 12/2018 | Kao | .................... H01L 23/5384 |
| 2017/0117316 | A1 * | 4/2017 | Hsu | .................... H01L 27/14603 |
| 2019/0295884 | A1 | 9/2019 | Liu et al. | |
| 2020/0168574 | A1 * | 5/2020 | Huang | .................... H01L 24/16 |

* cited by examiner

*Primary Examiner* — Shahed Ahmed
*Assistant Examiner* — Vicki B. Booker
(74) *Attorney, Agent, or Firm* — Foley & Lardner LLP

(57) ABSTRACT

A semiconductor device package and a method of manufacturing the same are provided. The semiconductor device package includes a circuit structure. The circuit structure includes a dielectric layer and a bonding pad. The dielectric layer has a first dielectric surface and a second dielectric surface opposite to the first dielectric surface, where the dielectric layer defines a recess in the first dielectric surface, and the recess includes a sidewall. The bonding pad is disposed in the recess, where a first pad surface of the bonding pad is adjacent to the first dielectric surface, a second pad surface of the bonding pad is adjacent to the second dielectric surface, and an edge of the bonding pad is spaced from the sidewall of the recess by a first distance.

17 Claims, 25 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package that includes a circuit structure.

2. Description of the Related Art

There is a continuing desire to incorporate more than one semiconductor component into a single semiconductor package to reduce dimensions of the package. Because semiconductor components in a semiconductor package specify electrical connections to the external environment, it would be desirable to provide a semiconductor device package including a circuit structure that can provide the semiconductor packages with reliable electrical connections where the semiconductor components can function properly or can achieve the specified performances and at the same time satisfy the miniaturization demand.

SUMMARY

In an aspect, a semiconductor device package includes a circuit structure. The circuit structure includes a dielectric layer and a bonding pad. The dielectric layer has a first dielectric surface and a second dielectric surface opposite to the first dielectric surface, where the dielectric layer defines a recess in the first dielectric surface, and the recess includes a sidewall. The bonding pad is disposed in the recess, where a first pad surface of the bonding pad is adjacent to the first dielectric surface, a second pad surface of the bonding pad is adjacent to the second dielectric surface, and an edge of the bonding pad is spaced from the sidewall of the recess by a first distance.

In an aspect, a semiconductor device package includes a circuit structure. The circuit structure includes a dielectric layer and a bonding pad. The dielectric layer has a first dielectric surface and a second dielectric surface opposite to the first dielectric surface, where the dielectric layer defines a recess in the first dielectric surface. The bonding pad is disposed in the recess, where a first pad surface of the bonding pad is adjacent to the first dielectric surface, a second pad surface of the bonding pad is adjacent to the second dielectric surface, where the bonding pad includes an indentation.

In an aspect, a method of manufacturing a semiconductor device package includes: providing a dielectric layer having a first dielectric surface, a second dielectric surface opposite to the first dielectric surface, and a first opening; forming a seed layer on a sidewall of the first opening and the first dielectric surface of the dielectric layer; using a sacrificial layer to cover a portion of the seed layer on the first dielectric surface; forming a bonding pad in the first opening of the dielectric layer using another portion of the seed layer exposed from the sacrificial layer; removing sacrificial layer; and forming a conductive trace layer on the first dielectric surface using the portion of the seed layer exposed from the bonding pad.

BRIEF DESCRIPTION OF THE DRAWINGS

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, and FIG. 5O illustrate a method of manufacturing a semiconductor device package such as the semiconductor device package of FIG. 3.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O illustrate a method of manufacturing a semiconductor device package such as the semiconductor device package of FIG. 4.

FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L, FIG. 7M, FIG. 7N, and FIG. 7O illustrate a method of manufacturing a semiconductor device package according to some embodiments of the present disclosure.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor device package including a circuit structure, where the circuit structure includes a dielectric layer and a bonding pad. The dielectric layer defines a recess having a sidewall. The bonding pad is disposed in the recess and spaced from the sidewall of the recess by a distance so that the subsequent photograph process capability for disposing a bonding pad in the recess may be improved as it may provide more space to accommodate a deviated photoresist. In addition, a seed layer and/or a conductive trace layer may be disposed between the sidewall of the recess and the bonding pad and provide more interlocking effect to the bonding pad and improve the bonding effect thereof.

In some embodiments, the present disclosure provides a semiconductor device package where the circuit structure includes a dielectric layer and a bonding pad. The dielectric layer defines a recess. The bonding pad is disposed in the recess and includes an indentation from a pad surface of the bonding pad so a conductive trace layer may be disposed in the indentation and engaged with the pad surface of the bonding pad, which may provide more interlocking effect to the bonding pad and improve the bonding effect and water blocking effect thereof.

In addition, because of the special structural arrangements of the recess, the bonding pad, and the conductive trace layer, the conductive trace layer may be thinner and the uniformity of the conductive trace layer and the layer disposed thereon (e.g., a RDL) may also be improved.

Figure 1A:
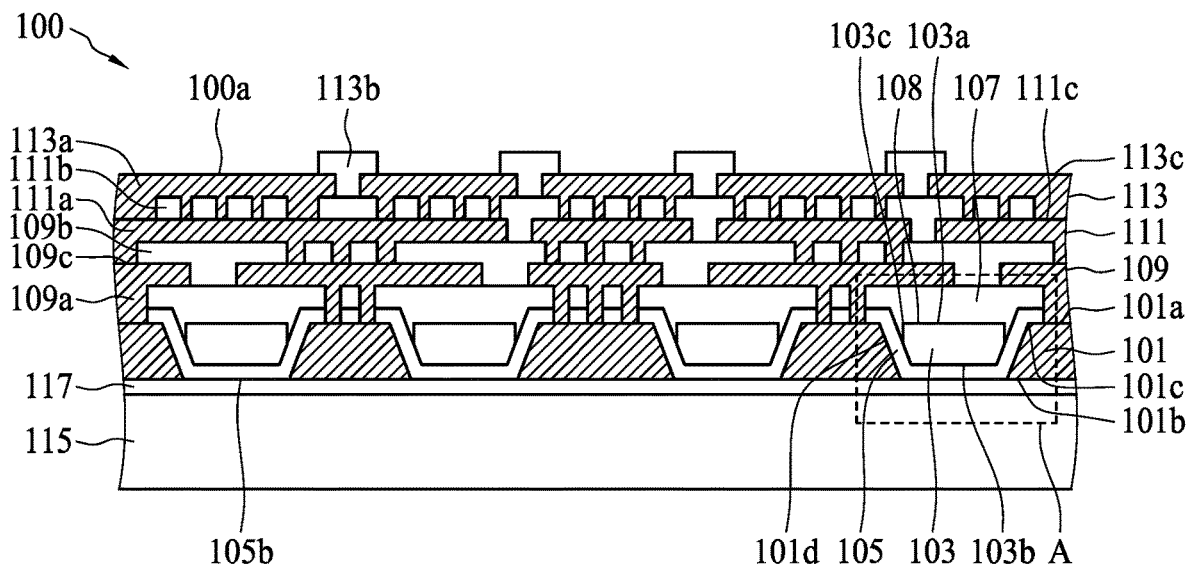
FIG. 1A illustrates a cross-sectional view of a semiconductor device package according to some embodiments of the present disclosure.

FIG. 1A illustrates a cross-sectional view of a semiconductor device package according to some embodiments of the present disclosure. The semiconductor device package of FIG. 1A includes a circuit structure 100 including a dielectric layer 101 and a bonding pad 103.

The dielectric layer 101 has a first dielectric surface 101a and a second dielectric surface 101b opposite to the first dielectric surface 101a. The dielectric layer 101 defines a recess 101c in the first dielectric surface 101a. The recess 101c includes a sidewall 101d. The sidewall 101d of the recess 101c may incline inwardly from the first dielectric surface 101a toward the second dielectric surface 101b. The sidewall 101d of the recess 101c may be substantially perpendicular to the first dielectric surface 101a and the second dielectric surface 101b. Compared to a recess 101c having a sidewall 101d substantially perpendicular to the first dielectric surface 101a and the second dielectric surface 101b, disposing a recess 101c as having a sidewall 101d inclining inwardly from the first dielectric surface 101a toward the second dielectric surface 101b may enhance the process capability for the subsequent photography process for defining the position for the corresponding bonding pad as moderate shifting of the photoresist disposition can be tolerated. In addition, such structural arrangement may enhance the step coverage of the subsequent first seed layer 105 as such inclination may provide smoother surface for metal disposition than a surface having a right angel. Therefore, the first seed layer 105 may have better step coverage with less breakage.

The dielectric layer 101 may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the dielectric layer 101 includes polyimide.

The bonding pad 103 is disposed in the recess 101c of the dielectric layer 101. The bonding pad 103 has a first pad surface 103a and a second pad surface 103b opposite to the first pad surface 103a. In some embodiments, the first pad surface 103a is adjacent to the first dielectric surface 101a of the dielectric layer 101 and the second pad surface 103b is adjacent to the second dielectric surface 101b of the dielectric layer 101, and an edge 103c of the bonding pad 103 is spaced from the sidewall 101d of the recess 101c by a first distance d1 (shown in FIG. 1B). The bonding pad 103 may be, for example, a contact pad of a trace or a ball pad. In some embodiments, the bonding pad 103 is a ball pad.

In some embodiments, a first seed layer 105 may be further included in the circuit structure 100. The first seed layer 105 may be disposed in the recess 101c of the dielectric layer 101. In some embodiments, the first seed layer 105 is disposed between the edge 103c of the bonding pad 103 and the sidewall 101d of the recess 101c of the dielectric layer 101. In some embodiments, the first seed layer 105 is disposed in conformity with the sidewall 101d of the recess 101c. In some embodiments, the first seed layer 105 is disposed in conformity with the sidewall 101d of the recess 101c and extends over the first dielectric surface 101a of the dielectric layer 101. In some embodiments, the first seed layer 105 is spaced from the edge 103c of the bonding pad 103 by a second distance d2 (shown in FIG. 1B). By disposing the first seed layer 105 as having the second distance d2 from the bonding pad 103, a space may be produced between the first seed layer 105 and the bonding pad 103, which may accommodate a conductive trace layer 107 to provide an interlocking effect to the bonding pad 103, which may also enhance the bonding effect between the first seed layer 105 and the bonding pad 103, particularly when the conductive trace layer 107 and the bonding pad 103 involve different materials. The first seed layer 105 may include, for example, one of, or a combination of, copper, gold, indium, tin, silver, palladium, osmium, iridium, ruthenium, titanium, magnesium, aluminum, cobalt, nickel, or zinc, or other metals or metal alloys.

In some embodiments, a conductive trace layer 107 may be further included in the circuit structure 100. The conductive trace layer 107 may be disposed adjacent to the first dielectric surface 101a of the dielectric layer 101. In some embodiments, the conductive trace layer 107 is disposed adjacent to the first pad surface 103a of the bonding pad 103. In some embodiments, the conductive trace layer 107 is disposed adjacent to the first pad surface 103a of the bonding pad 103 and the first seed layer 105. In some embodiments, the conductive trace layer 107 electrically connects to the bonding pad 103. In some embodiments, the conductive trace layer 107 is disposed on (e.g., physical contact or embedded in and exposed by) the first pad surface 103a of the bonding pad 103 and forms a first interface 108 with the first pad surface 103a. In some embodiments, the conductive trace layer 107 extends from the first dielectric surface 101a toward the second dielectric surface 101b and disposed between the sidewall 101d of the recess 101c of the dielectric layer 101 and the edge 103c of the bonding pad 103. In some embodiments, the conductive trace layer 107 extends from the first dielectric surface 101a toward the space between the first seed layer 105 and the bonding pad 103, which may provide an interlocking effect between the conductive trace layer 107 and the bonding pad 103. A height of the conductive trace layer 107 is different from a height of the bonding pad 103. In some embodiments, the height of the conductive trace layer 107 is smaller than the height of the bonding pad 103.

The conductive trace layer 107 may include, for example, one of, or a combination of, copper, gold, indium, tin, silver, palladium, osmium, iridium, ruthenium, titanium, magnesium, aluminum, cobalt, nickel, or zinc, or other metals or metal alloys.

In some embodiments, at least one redistribution layer (RDL) 109, 111, 113 may be included in the circuit structure 100. The RDL 109, 111, 113 may be disposed adjacent to the first dielectric surface 101a of the dielectric layer 101. The RDL 109, 111, 113 may contain a dielectric layer 109a, 111a, 113a and at least one conductive trace 109b, 111b, 113b disposed thereon, respectively for redistributing electrical signals to external electrical connectors or to another RDL. In some embodiments, such as the one illustrated in FIG. 1A, the circuit structure 100 includes the first RDL 109, the second RDL 111, and the third RDL 113, which may include a portion of the conductive traces that electrically connect to each other vertically, a portion of the conductive traces that electrically connect to each other horizontally, or both.

The first RDL 109 may be the layer disposed adjacent to the first dielectric surface 101a of the dielectric layer 101. The first conductive trace 109b may be disposed adjacent to a top surface 109c of the first RDL dielectric layer 109a. In some embodiments, the first conductive trace 109b is disposed on (e.g., physical contact or embedded in and exposed by) the top surface 109c of the first RDL dielectric layer 109a. The first conductive trace 109b may electrically connect to the second conductive trace 111b of the second RDL 111, the conductive trace layer 107, or both. In some embodiments, the first conductive trace 109b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The third RDL 113 may be the top layer of the circuit structure 100. The third RDL 113 may be disposed adjacent to the top surface 111c of the second RDL 111. A third conductive trace 113b may be disposed adjacent to the top surface 113c of the third RDL 113. In some embodiments, the third conductive trace 113b is disposed on (e.g., physical contact or embedded in and exposed by) the top surface 113c of the third RDL dielectric layer 113. The third conductive trace 113b may include an electrical connector (e.g., a bonding pad, a pillar or a solder/stud bump). The third conductive trace 113b may electrically connect to the second RDL 111 or a semiconductor element. In some embodiments, such as the one illustrated in FIG. 1A, the third conductive trace 113b electrically connects to the second conductive trace 111b of the second RDL 111. The third conductive trace 113b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The RDL 109, 111, 113 may electrically connect to the dielectric layer 101. In some embodiments, the RDL 109, 111, 113 electrically connects to the bonding pad 103 of the dielectric layer 101. In some embodiments, the RDL 109, 111, 113 is disposed on (e.g., physical contact or embedded in and exposed by) the conductive trace layer 107 and electrically connects to the bonding pad 103 through the conductive trace layer 107.

In some embodiments, a carrier 115 may be included in the circuit structure 100. The carrier 115 may be provided to support the dielectric layer 101, the first seed layer 105, the bonding pad 103, and any RDL 109, 111, 113 disposed thereon, if specified. The carrier 115 may be disposed adjacent to the second dielectric surface 101b of the dielectric layer 101. In some embodiments where the first seed layer 105 is provided, the carrier 115 is disposed adjacent to a bottom surface 105b of the first seed layer 105 and the second dielectric surface 101b of the dielectric layer 101.

In some embodiments, a second seed layer 117 may be included in the circuit structure 100. The second seed layer 117 may be disposed between the dielectric layer 101 and the carrier 115. In some embodiments, the second seed layer 117 is disposed on (e.g., physical contact or embedded in and exposed by) the bottom surface 105b of the first seed layer 105 and the second dielectric surface 101b of the dielectric layer 101. The second seed layer 117 may include, for example, one of, or a combination of, copper, gold, indium, tin, silver, palladium, osmium, iridium, ruthenium, titanium, magnesium, aluminum, cobalt, nickel, or zinc, or other metals or metal alloys.

Figure 1B:
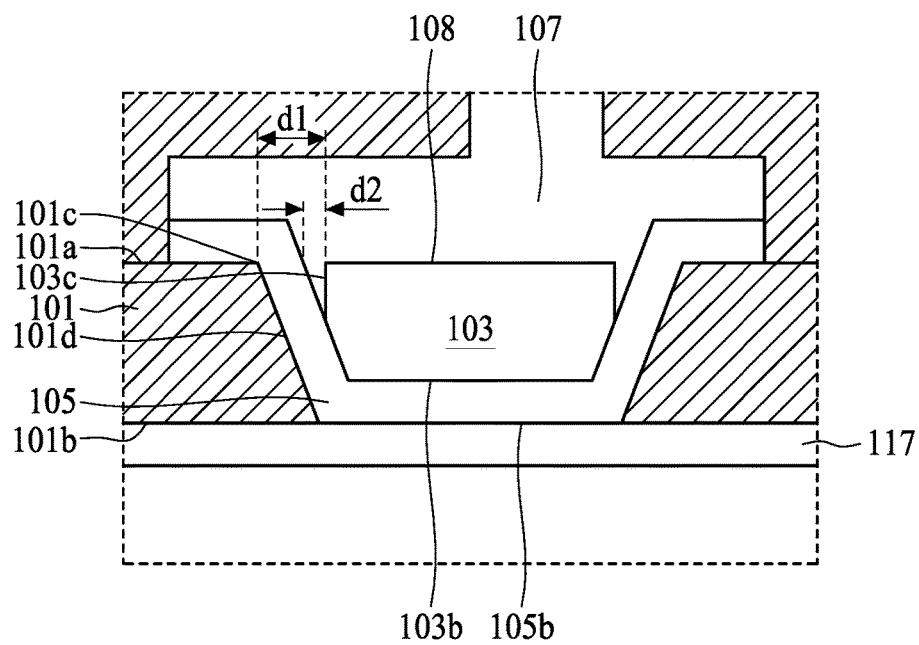
FIG. 1B illustrates an enlarged view of region A of the semiconductor device package illustrated in FIG. 1A.

FIG. 1B illustrates an enlarged view of a region A of the semiconductor device package illustrated in FIG. 1. In some embodiments, such as the one illustrated in FIG. 1B, the dielectric layer 101 is disposed on (e.g., physical contact or embedded in and exposed by) the second seed layer 117 and the recess 101c of the dielectric layer 101 overlaps a portion of the second seed layer 117. The recess 101c has a sidewall 101d inclining inwardly from the first dielectric surface 101a of the dielectric layer 101 to the second dielectric surface 101b of the dielectric layer 101. By designing the dielectric layer 101 as having such recess 101c, the subsequent photograph process capability for disposing the bonding pad 103 in the recess 101c may be improved as it may provide more space to accommodate a deviated photoresist. Therefore, it may not be necessary to dispose the photoresist at an exact position in order to define the position for disposing the bonding pad 103.

The first seed layer 105 is disposed in the recess 101c, which is in conformity with the sidewall 101d of the recess 101c and in contact with the second seed layer 117. In some embodiments, the bottom surface 105b of the first seed layer 105 and the second dielectric surface 101b of the dielectric layer 101 are in substantially the same plane. In some embodiments, the first seed layer 105 extends from the first dielectric surface 101a of the dielectric layer 101 to the second dielectric surface 101b of the dielectric layer 101 and covers the bottom surface 103b of the bonding pad 103. By disposing the first seed layer 105 in the recess 101c and between the dielectric layer 101 and the bonding pad 103, it may protect the dielectric layer 101 from moisture and other environment conditions, and enhance the bonding effect between the dielectric layer 101 and the bonding pad 103 so fewer cracks or delamination between them would occur.

The bonding pad 103 is disposed in the recess 101c and on (e.g., physical contact) the first seed layer 105. The edge 103c of the bonding pad 103 is spaced from the sidewall 101d of the recess 101c by the first distance d1. The edge 103c of the bonding pad 103 is spaced from the first seed layer 105 by a second distance d2. The first distance d1 is larger than the second distance d2. The first distance d1 between the sidewall 101d of the recess 101c and the edge 103c of the bonding pad 103 becomes smaller from the first dielectric surface 101a toward the second dielectric surface 101b. The second distance d2 between the first seed layer 105 and the edge 103c of the bonding pad 103 also becomes smaller from the first dielectric surface 101a toward the second dielectric surface 101b. By providing a distance between the bonding pad 103 and the first seed layer 105 (or the sidewall 101d of the recess 101c of the dielectric layer 101), a space can be produced, which may accommodate the conductive trace layer 107 disposed therein. Therefore, an interlocking effect may be produced among the first seed layer 105, the conductive trace layer 107, and the bonding pad 103, which may strengthen the bonding effect among them, in particular when the conductive trace layer 107 and the bonding pad 103 involve different materials.

Figure 2:
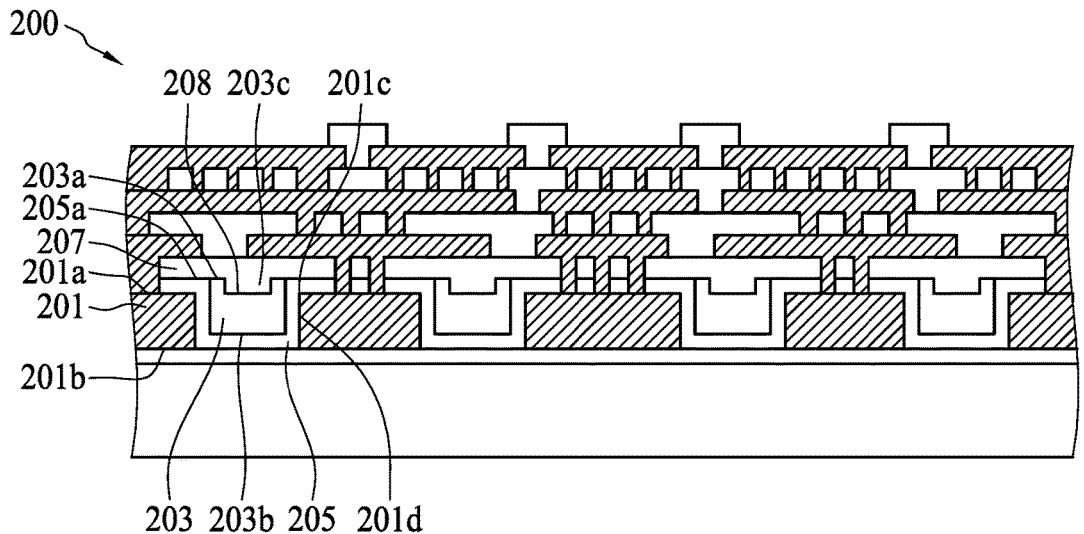
FIG. 2 illustrates a cross-sectional view of a semiconductor device package according to some embodiments of the present disclosure.

FIG. 2 illustrates a cross-sectional view of a semiconductor device package according to some embodiments of the present disclosure. The semiconductor device package is similar to that illustrated in FIG. 1A, with a difference including that the sidewall 201d of the recess 201c of the circuit structure 200 is substantially perpendicular to the first dielectric surface 201a and the second dielectric surface 201b and the bonding pad 203 includes an indentation 203c indented from the first pad surface 203a of the bonding pad 203.

The first dielectric layer 201 defines a recess 201c in the first dielectric surface 201a. The recess 201c includes a sidewall 201d. The sidewall 201d of the recess 201c may incline inwardly from the first dielectric surface 201a toward the second dielectric surface 201b or be substantially perpendicular to the first dielectric surface 201a and the second dielectric surface 201b. In some embodiments, such as the one illustrated in FIG. 2, the sidewall 201d of the recess 201c is substantially perpendicular to the first dielectric surface 201a and the second dielectric surface 201b.

The bonding pad 203 has a first pad surface 203a and a second pad surface 203b opposite to the first pad surface 203a. The bonding pad 203 includes an indentation 203c indented from the first pad surface 203a of the bonding pad 203. The indentation 203c of the bonding pad 203 may locate at approximately a center of the first pad surface 203a of the bonding pad 203. A portion of the first pad surface 203a of the bonding pad 203 may be in substantially the same plane with the top surface 205a of the first seed layer 205. In some embodiments, an edge of the first pad surface 203a of the bonding pad 203 is in substantially the same plane with the top surface 205a of the first seed layer 205.

In some embodiments, a conductive trace layer 207 may be further included in the circuit structure 200. The conductive trace layer 207 may be disposed adjacent to the first dielectric surface 201a of the first dielectric layer 201. In some embodiments, the conductive trace layer 207 is disposed adjacent to the first pad surface 203a of the bonding pad 203. In some embodiments, the conductive trace layer 207 is disposed adjacent to the first pad surface 203a of the bonding pad 203 and the first seed layer 205. In some embodiments, the conductive trace layer 207 electrically connects to the bonding pad 203. In some embodiments, the conductive trace layer 207 is disposed on (e.g., physical contact or embedded in and exposed by) on the first pad surface 203a of the bonding pad 203 and fills in the indentation 203c and engaged with the first pad surface 203a of the bonding pad 203. The conductive trace layer 207 may form a first interface 208 with the first pad surface 203a. By designing the bonding pad 203 as having the indentation 203c at the first pad surface 203a, the conductive trace layer 207 may hold onto the bonding pad 203 more tightly to strengthen the bonding effect between them.

Figure 3:
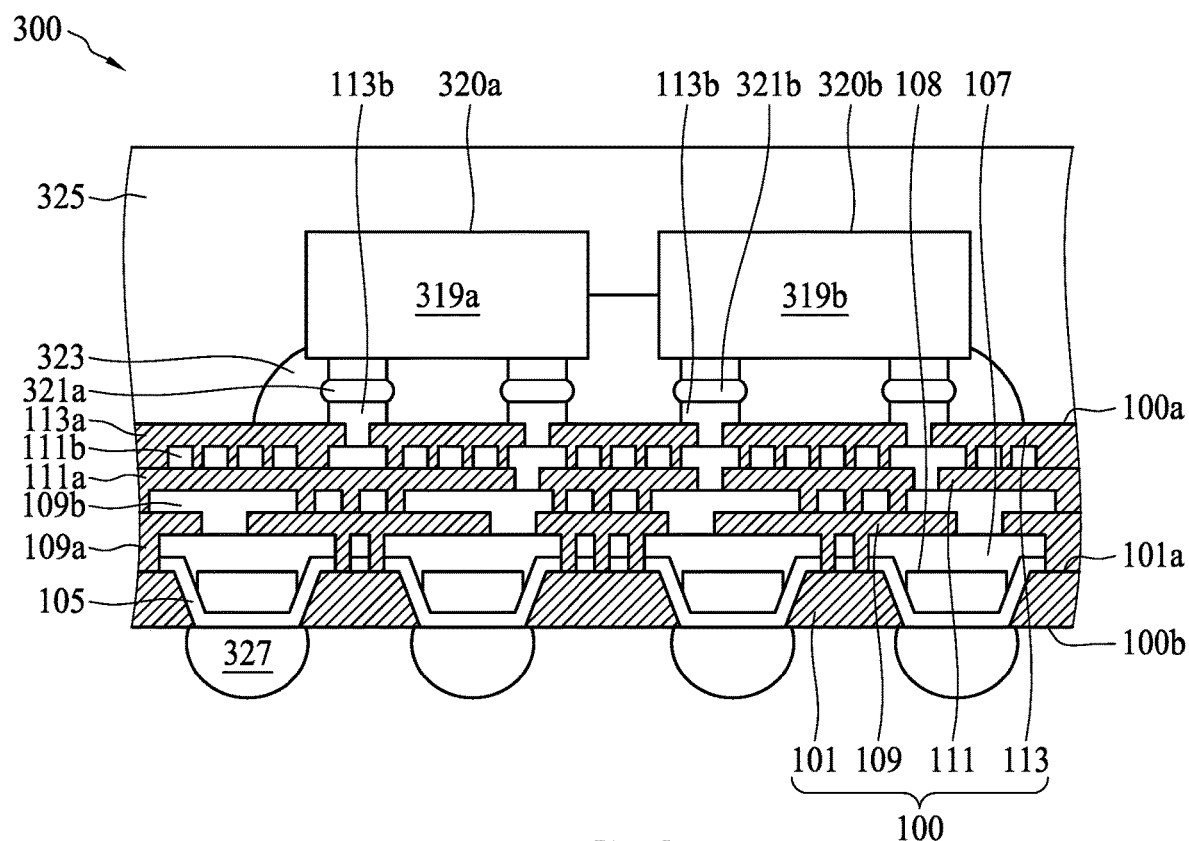
FIG. 3 illustrates a cross-sectional view of a semiconductor device package according to some embodiments of the present disclosure.

FIG. 3 illustrates a cross-sectional view of a semiconductor device package 300 according to some embodiments of the present disclosure. The semiconductor device package 300 includes a circuit structure 100, at least one semiconductor element 319a, 319b, and at least one electrical connector 327.

The circuit structure 100 is similar to that illustrated in FIG. 1A, of which the components are not described repeatedly for brevity.

The circuit structure 100 has a first circuit surface 100a and a second circuit surface 100b opposite to the first circuit surface 100a. The semiconductor element 319a, 319b is disposed adjacent to a first circuit surface 100a of the circuit structure 100. In some embodiments, the semiconductor element 319a, 319b electrically connects to the circuit structure 100. In some embodiments, the semiconductor element 319a, 319b electrically connects to the circuit structure 100 through the conductive terminal 321a, 321b. The semiconductor element 319a, 319b may be a die, a chip, a package, an interposer, or a combination thereof. In some embodiments, the semiconductor element 319a, 319b is a die. The conductive terminal 321a, 321b may be a pillar or a solder/stud bump.

The electrical connector 327 is disposed adjacent to the second circuit surface 100b of the circuit structure 100. In some embodiments, the electrical connector 327 electrically connects to the second circuit surface 100b of the circuit structure 100. In some embodiments, the first seed layer 105 is exposed from the second circuit surface 100b of the circuit structure 100 and the electrical connector 327 electrical connects to the second circuit surface 100b of the circuit structure 100 by contacting the first seed layer 105. The electrical connector 327 may be a pillar or a solder/stud bump. In some embodiments, the electrical connector 327 is a solder bump.

In some embodiments, an underfill 323 may be disposed between the semiconductor element 319a, 319b and the circuit structure 100 to protect the conductive terminal 321a, 321b from oxidation, moisture, and other environment conditions to meet the packaging application criteria. It should be noted that the underfill 323 may not be necessary.

In some embodiments, an encapsulant 325 is disposed adjacent to the first circuit surface 100a of the circuit structure 100. In some embodiments, the encapsulant 325 covers a portion of the first circuit surface 100a of the circuit structure 100, a portion of the underfill 323, and a portion of the semiconductor element 319a, 319b. In some embodiments, the encapsulant 325 surrounds the underfill 323. In some embodiments, the encapsulant 325 surrounds the semiconductor element 319a, 319b. In some embodiments, the encapsulant 325 surrounds the semiconductor element 319a, 319b and exposes at least a portion of the top surface 320a, 320b of the semiconductor element 319a, 319b. By exposing at least a portion of the top surface 320a, 320b of the semiconductor element 319a, 319b, the heat dissipation effect of the semiconductor element 319a, 319b may be improved. In some embodiments, a heat sink may be further disposed adjacent to the exposed portion of the top surface 320a, 320b of the semiconductor element 319a, 319b to further improve the heat dissipation. In some embodiments, the encapsulant 325 surrounds the semiconductor element 319a, 319b and covers the top surface 320a, 320b of the semiconductor element 319a, 319b entirely (e.g., the semiconductor element 319a, 319b is embedded in the encapsulant 325). The encapsulant 325 may be, for example, a solder mask (the material of which is, for example, polyimide (PI)), a passivation layer (the material of which is, for example, a metal oxide), or an underfill. The encapsulant 325 may include fillers, the material of which is, for example, silica and/or carbon for reducing stress on the die and warpage of a resulting semiconductor package.

Figure 4:
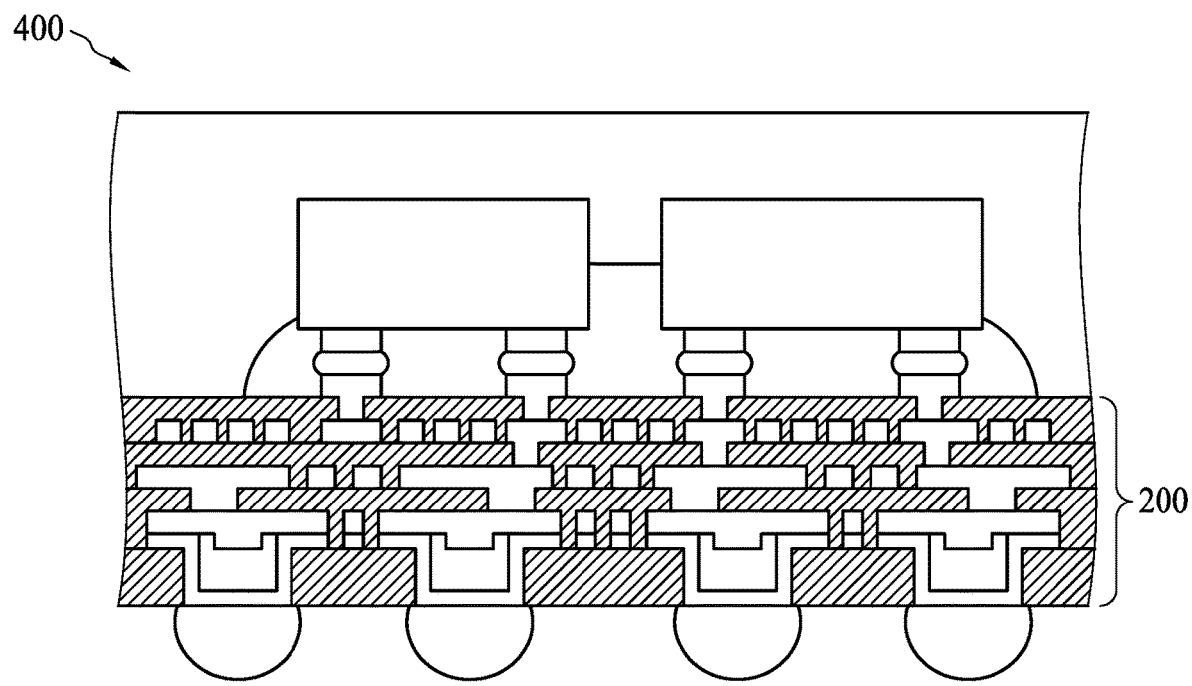
FIG. 4 illustrates a cross-sectional view of a semiconductor device package according to some embodiments of the present disclosure.

FIG. 4 illustrates a cross-sectional view of a semiconductor device package 400 according to some embodiments of the present disclosure. The semiconductor device package 400 is similar to that illustrated in FIG. 3, with a difference including that the circuit structure 200 of the semiconductor device package 400 is similar to that illustrated in FIG. 2, rather than the circuit structure 100 of the semiconductor device package 300 illustrated in FIG. 3. The components of the circuit structure 200 are similar to those illustrated in FIG. 2, which are not described repeatedly for brevity.

Figure 5A:
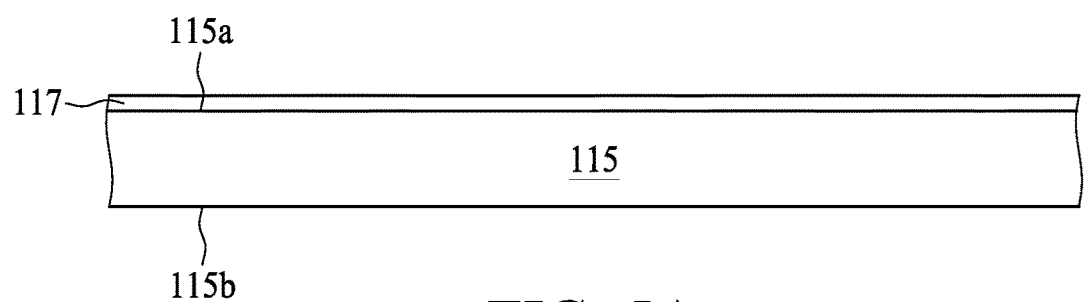
FIG. 5A, FIG. 5B, FIG. 5C, FIG. 5D, FIG. 5E, FIG. 5F, FIG. 5G, FIG. 5H, FIG. 5I, FIG. 5J, and FIG. 5K illustrate a method of manufacturing a semiconductor device package such as the semiconductor device package of FIG. 1A.

FIGS. 5A-5K illustrate a method of manufacturing a semiconductor device package such as the semiconductor device package of FIG. 1A. FIGS. 5A-5O illustrate a method of manufacturing a semiconductor device package such as the semiconductor device package of FIG. 3.

Referring to FIG. 5A, a carrier 115 is provided. The carrier 115 has a first carrier surface 115a and a second carrier surface 115b opposite to the first carrier surface 115a. A first seed layer 117 is disposed adjacent to the first carrier surface 115a of the carrier 115. The first seed layer 117 may be disposed by a lamination technique, a deposition technique, a sputtering technique, a plating technique, or other suitable process.

Figure 5B:
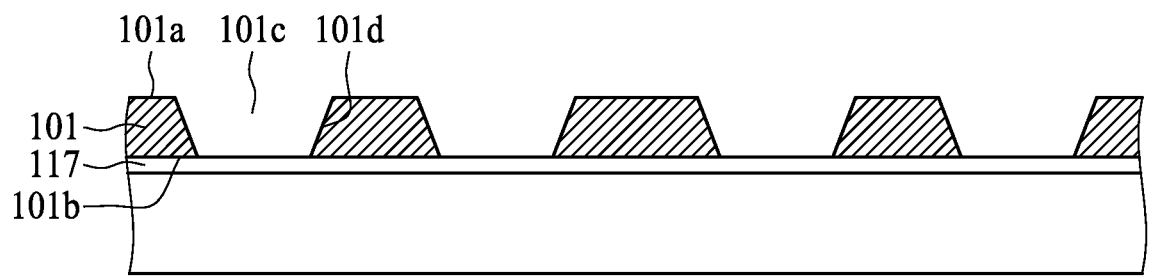

Referring to FIG. 5B, a dielectric layer 101 is disposed adjacent to the first seed layer 117. The dielectric layer 101 is patterned and defines at least one recess 101c overlapping a portion of the first seed layer 117. Each recess 101c may correspond to a respective bonding pad 103. The recess 101c includes a sidewall 101d. The sidewall 101d of the recess 101c may incline inwardly from the first dielectric surface 101a toward the second dielectric surface 101b or be substantially perpendicular to the first dielectric surface 101a and the second dielectric surface 101b. In some embodiments, such as the one illustrated in FIG. 5B, the sidewall 101d of the recess 101c inclines inwardly from the first dielectric surface 101a to the second dielectric surface 101b. The dielectric layer 101 may be disposed by, for example, a lamination technique or a coating technique. The recess 101c may be formed by a photolithography technique and an etching technique.

Figure 5C:
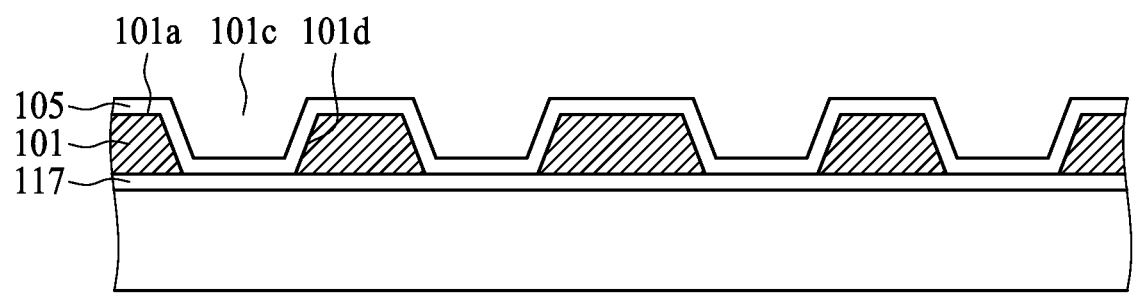

Referring to FIG. 5C, a second seed layer 105 is disposed on (e.g., physical contact or embedded in and exposed by) at least a portion of the first dielectric surface 101a of the dielectric layer 101, the exposed portion of the first seed layer 117, and the sidewall 101d of the recess 101c of the dielectric layer 101. In some embodiments, the second seed layer 105 covers at least a portion of the first dielectric surface 101a of the dielectric layer 101, a portion of the first seed layer 117, and is disposed in conformity with the sidewall 101d of the recess 101c of the dielectric layer 101. The second seed layer 105 may be disposed by a plating technique, a physical vapor deposition technique, or other suitable process.

Figure 5D:
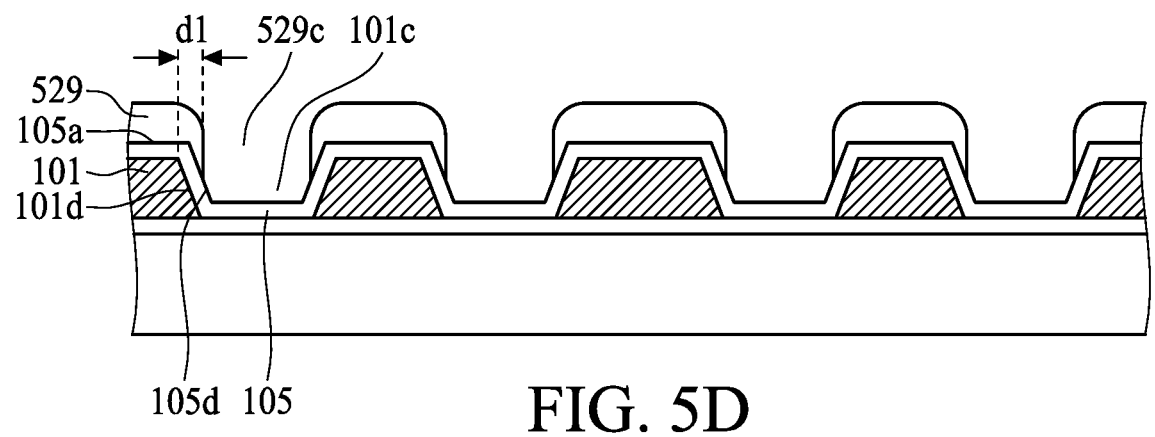

Referring to FIG. 5D, a first sacrificial layer 529 is disposed adjacent to the second seed layer 105. The first sacrificial layer 529 is patterned and defines at least one opening 529c exposing a portion of the second seed layer 105. Each opening 529c may correspond to a respective bonding pad 103. In some embodiments, the first sacrificial layer 529 covers at least a portion of the top surface 105a of the second seed layer 105 and a portion of the sidewall 105d of the second seed layer 105. After disposing the first sacrificial layer 529, the first distance d1 may be provided between the edge 103c of the bonding pad 103 and the sidewall 101d of the recess 101c. In some embodiments, the first distance d1 is not smaller than 4 micrometers so the process capability for the subsequent photography process for defining the position for the corresponding bonding pad 103 may be enhanced, and the moderate shifting of the photoresist disposition may be tolerated. A conductive trace layer 107 may be disposed between the sidewall 101d of the recess 101c and the bonding pad 103 and provide more interlocking effect to the bonding pad 103 (shown in FIG. 5E).

The first sacrificial layer 529 may be, for example, a solder mask (the material of which is, for example, polyimide (PI)). The first sacrificial layer 529 may be disposed by, for example, a lamination technique or a coating technique. The opening 529c may be formed by a photolithography technique and an etching technique.

Figure 5E:
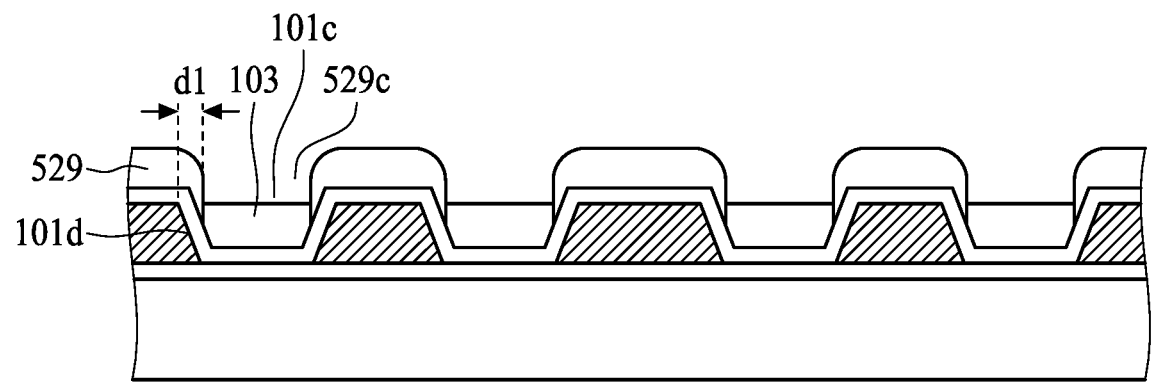

Referring to FIG. 5E, a bonding pad 103 is disposed in the opening 529c defined by the first sacrificial layer 529. The bonding pad 103 may be disposed in conformity with the shape of the opening 529c. The bonding pad 103 may be disposed by, for example, a plating technique such as electroplating, or other suitable process.

Figure 5F:
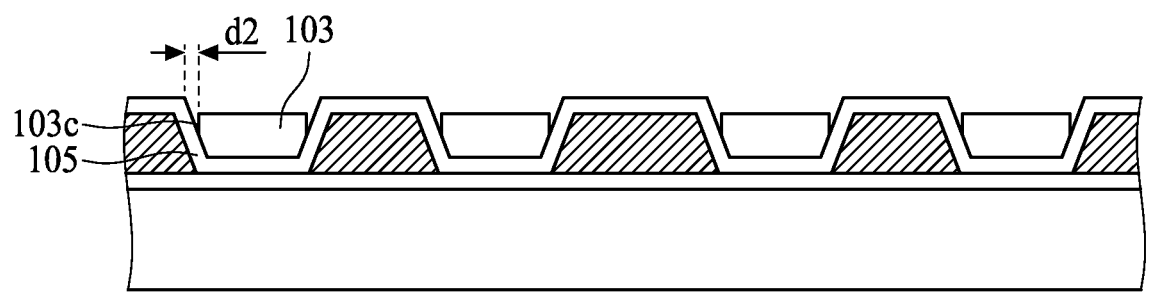

Referring to FIG. 5F, the first sacrificial layer 529 is removed. The first sacrificial layer 529 may be removed by, for example, a striping and cleaning technique or other suitable technique. After removal of the first sacrificial layer 529, a space may be produced between the second seed layer 105 and the bonding pad 103. That is, the first seed layer 105 may be spaced from the edge 103c of the bonding pad 103 by a second distance d2.

Figure 5G:
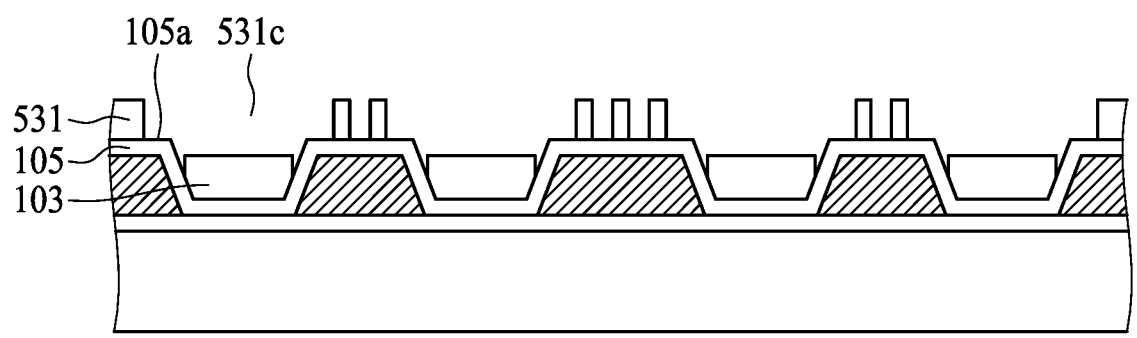

Referring to FIG. 5G, a second sacrificial layer 531 is disposed adjacent to the second seed layer 105. The second sacrificial layer 531 is patterned and defines at least one opening 531c exposing a portion of the second seed layer 105 and at least a portion of the bonding pad 103. Each opening 531c may correspond to a respective conductive trace layer 107. In some embodiments, the second sacrificial layer 531 covers at least a portion of the top surface 105a of the second seed layer 105. The second sacrificial layer 531 may be, for example, a solder mask (the material of which is, for example, polyimide (PI)). The second sacrificial layer 531 may be disposed by, for example, a lamination technique or a coating technique. The opening 531c may be formed by a photolithography technique and an etching technique.

Figure 5H:
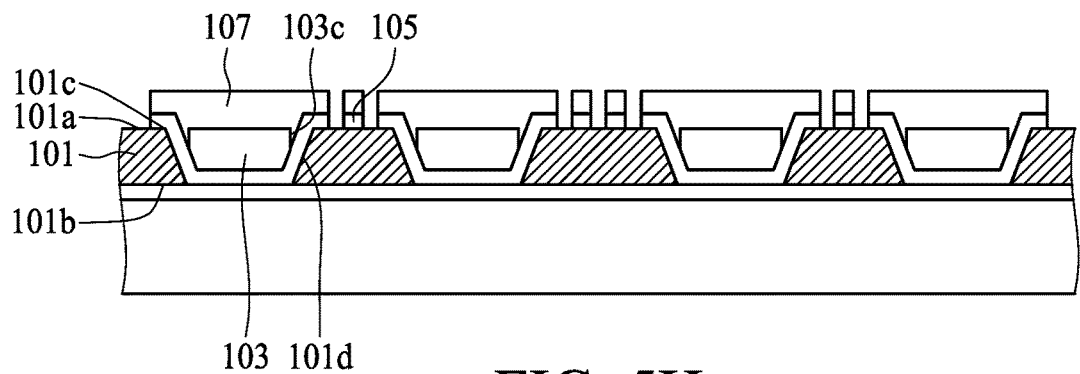

Referring to FIG. 5H, a conductive trace layer 107 is disposed in the opening 531c defined by the second sacrificial layer 531 and adjacent to the first dielectric surface 101a of the dielectric layer 101. The conductive trace layer 107 may be disposed on (e.g., physical contact or embedded in and exposed by) the exposed portions of the second seed layer 105 and the bonding pad 103. In some embodiments, the conductive trace layer 107 extends from the first dielectric surface 101a toward the second dielectric surface 101b and disposed between the sidewall 101d of the recess 101c of the dielectric layer 101 and the edge 103c of the bonding pad 103. The conductive trace layer 107 may be disposed by, for example, a plating technique such as electroplating, or other suitable process. As the conductive trace layer 107 may be disposed independently from the bonding pad 103, a thickness of the conductive trace layer above the first dielectric surface 101a of the dielectric layer 101 can be thinner compared to the one formed in a single process with the bonding pad 103 where the thickness of the conductive trace layer above the first dielectric surface 101a of the dielectric layer 101 will be the height of the conductive trace layer 107 and that of the bonding pad 103 in total. Therefore, the dielectric layer 101 and the conductive trace layer 107 can be thinner. Moreover, since the uniformity of the conductive trace layer 107 can be improved by reducing the thickness difference between the conductive trace layer above the dielectric layer 101 and that above the bonding pad 103, the uniformity of the layer disposed thereon (e.g., a RDL) may also be improved.

Figure 5I:
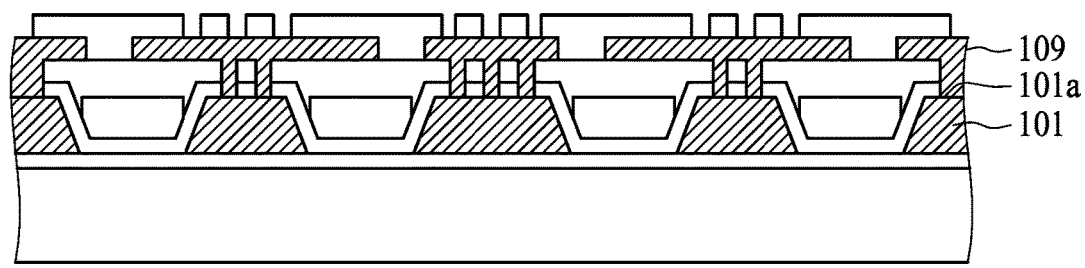

Referring to FIG. 5I, a first RDL 109 is disposed adjacent to the first dielectric surface 101a of the dielectric layer 101. The first RDL 109 may be disposed by a combination of a lamination technique, a photolithography technique, a plating technique, and an etching technique.

Figure 5J:
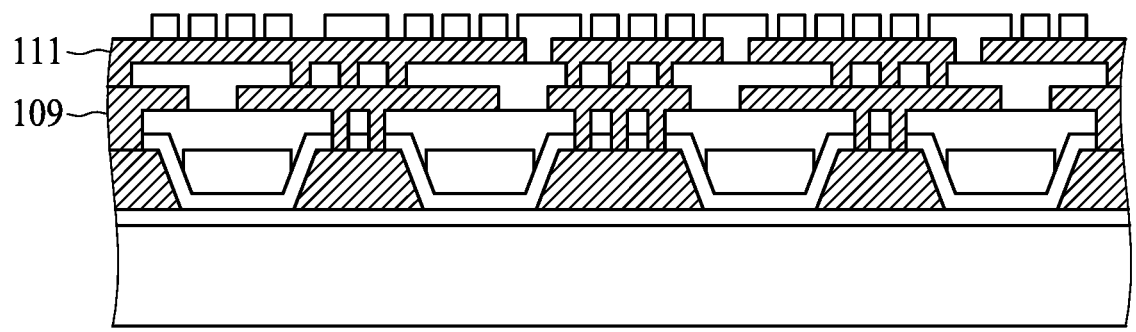

Referring to FIG. 5J, a second RDL 111 is disposed adjacent to the first RDL 109. The second RDL 111 may be disposed by a combination of a lamination technique, a photolithography technique, a plating technique, and an etching technique.

Figure 5K:
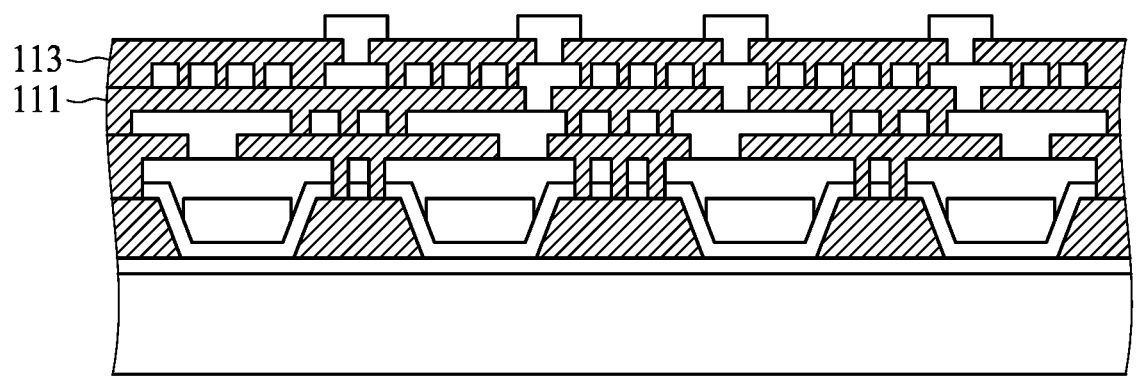

Referring to FIG. 5K, a third RDL 113 is disposed adjacent to the second RDL 111. The third RDL 113 may be disposed by a combination of a lamination technique, a photolithography technique, a plating technique, and an etching technique. Sequentially, a semiconductor device package such as the one illustrated in FIG. 1A may be obtained.

Figure 5L:
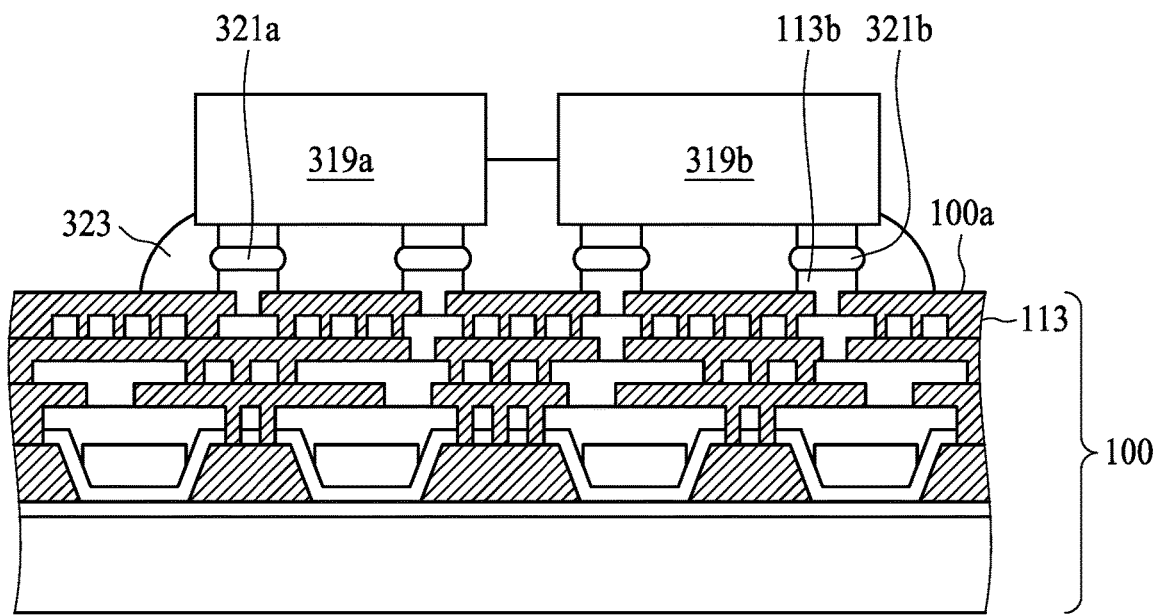

Referring to FIG. 5L, at least one semiconductor element 319a, 319b is disposed adjacent to the first circuit surface 100a of the circuit structure 100. The semiconductor element 319a, 319b may be electrically connected to the circuit structure 100 by disposing at least one conductive terminal 321a, 321b on the third conductive trace 113b of the third RDL 113 of the circuit structure 100. The conductive terminal 321a, 321b may be a pillar structure, which may include an under bump metallization (UBM) layer, a pillar, a barrier layer, and a solder layer. In some embodiments, the conductive terminal 321a, 321b is formed by, for example, a combination of a physical vapor deposition, plating, photolithography, etching, solder reflowing, or other suitable processes.

In some embodiments, an underfill 323 is disposed between the semiconductor element 319a, 319b and the circuit structure 100. The underfill 323 may surround the conductive terminal 321a, 321b.

Figure 5M:
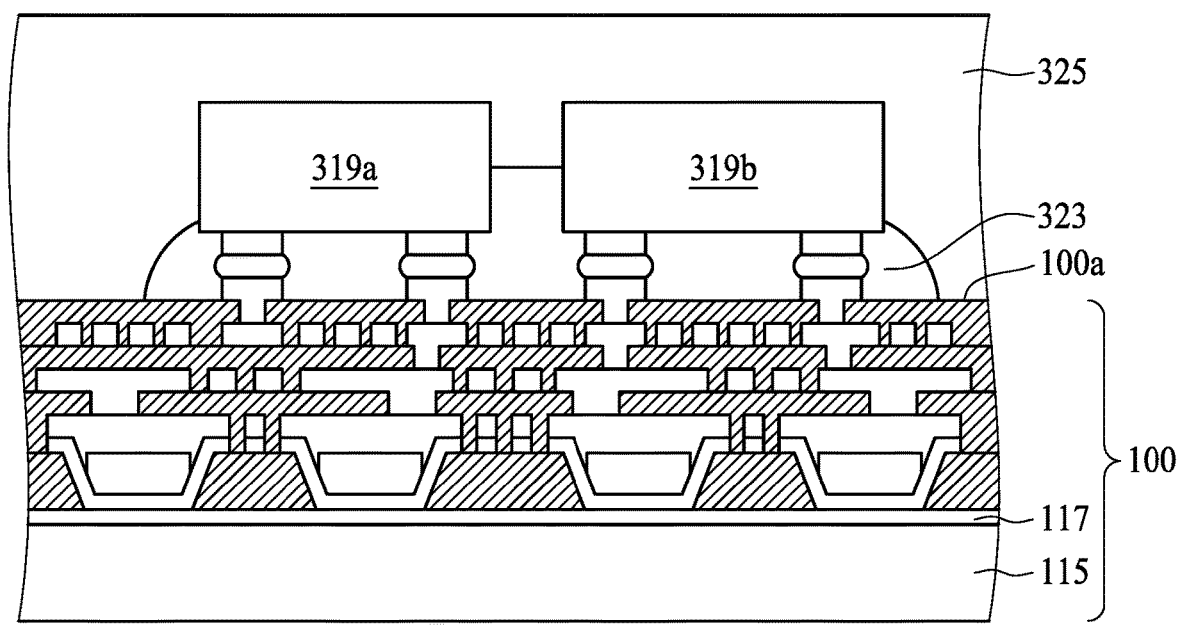

Referring to FIG. 5M, an encapsulant 325 is disposed adjacent to the first circuit surface 100a of the circuit structure 100. The encapsulant 325 may cover at least a portion of the first circuit surface 100a of the circuit structure 100, a portion of the underfill 323, and a portion or the entire top surface of the semiconductor element 319a, 319b. The encapsulant 325 may be formed by, for example, a molding technique.

Figure 5N:
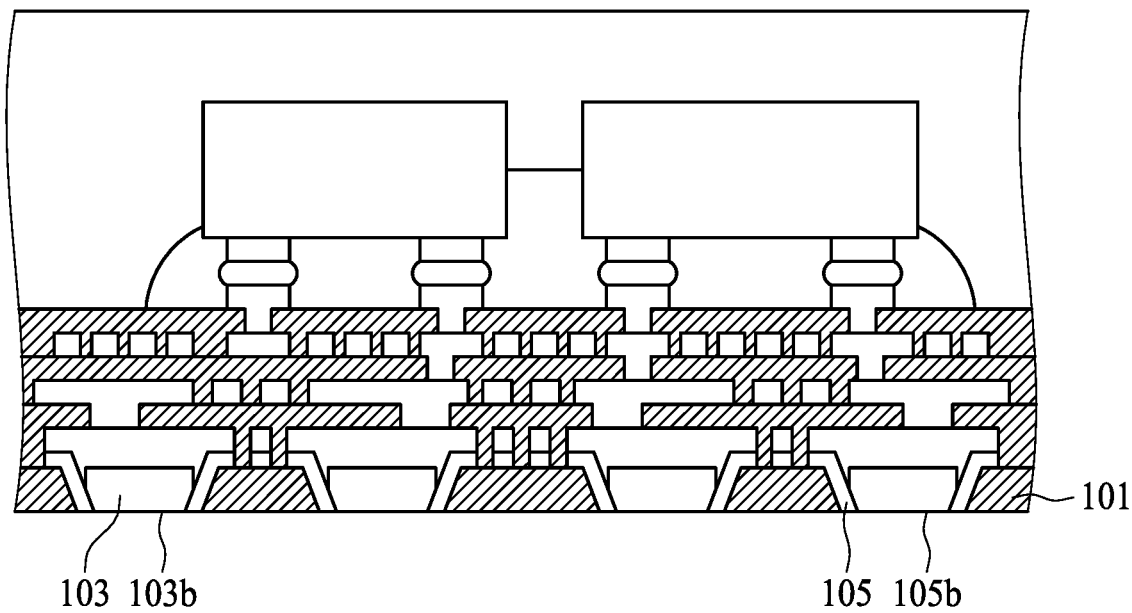
Figure 5O:
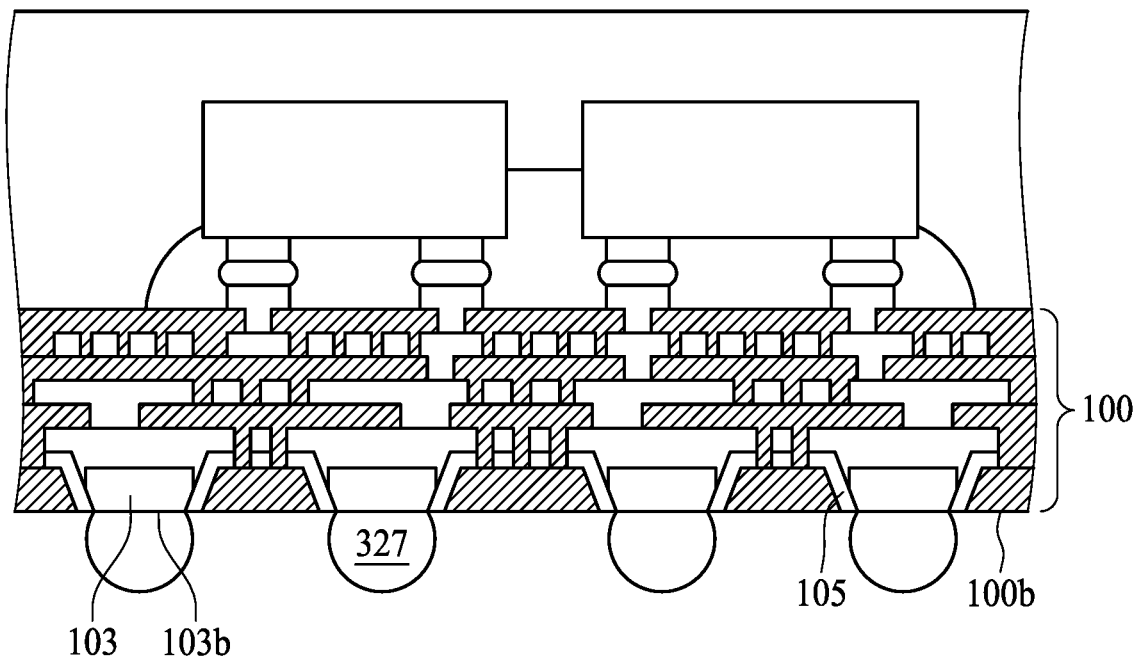

Referring to FIG. 5N, the carrier 115 and the first seed layer 117 is removed until the second pad surface 103b of the bonding pad 103 is exposed. The carrier 115 and the first seed layer 117 may be removed by, for example, a grinding technique, an etching technique, or other suitable processes.

Referring to FIG. 5O, at least one electrical connector 327 is disposed adjacent to the second circuit surface 100b of the circuit structure 100. In some embodiments, the electrical connector 327 is disposed on (e.g., physical contact or embedded in and exposed by) the portion of second pad surface 103b of the bonding pad 103 exposed from the second circuit surface 100b of the circuit structure 100 for external connection. The electrical connector 327 may be a solder ball, which may be formed by, for example, a solder ball placement technique or a solder paste printing technique, followed by a reflowing technique. Subsequently, a semiconductor device package (e.g., a semiconductor package 300 as is illustrated in FIG. 3) may be obtained.

Figure 6A:
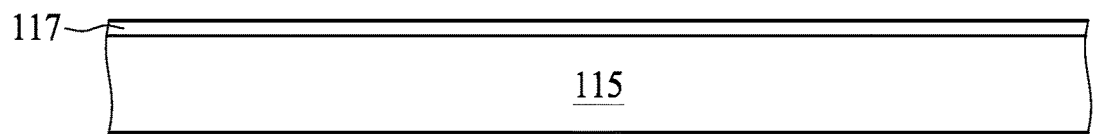
FIG. 6A, FIG. 6B, FIG. 6C, FIG. 6D, FIG. 6E, FIG. 6F, FIG. 6G, FIG. 6H, FIG. 6I, FIG. 6J, and FIG. 6K illustrate a method of manufacturing a semiconductor device package such as the semiconductor device package of FIG. 2.

FIGS. 6A-6K illustrate a method of manufacturing a semiconductor device package such as the semiconductor device package of FIG. 2. FIGS. 6A-6O illustrate a method of manufacturing a semiconductor device package such as the semiconductor device package of FIG. 4.

Referring to FIG. 6A, the processes illustrated in FIG. 6A for providing the carrier 115 and the first seed layer 117 are similar to those illustrated in FIG. 5A, which are not described repeatedly for brevity.

Figure 6B:
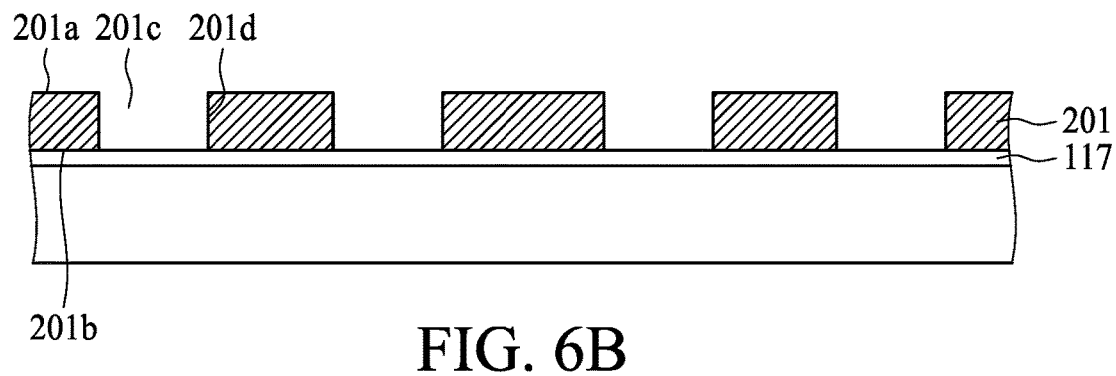

Referring to FIG. 6B, the processes illustrated in FIG. 6B for providing the dielectric layer 201 are similar to those illustrated in FIG. 5B, with a difference including that the recess 201c is formed as having a sidewall 201d substantially perpendicular to the first dielectric surface 201a and the second dielectric surface 201b of the dielectric layer 201.

Figure 6C:
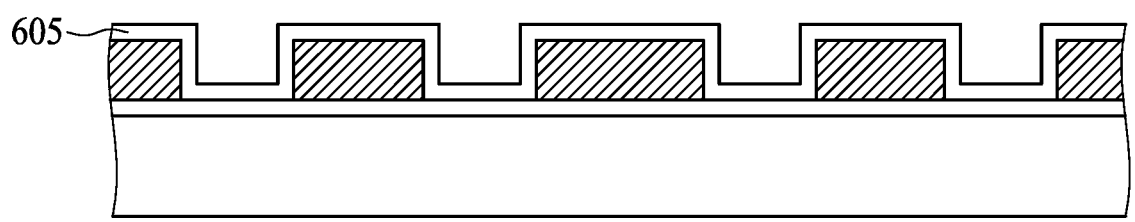

Referring to FIG. 6C, the processes illustrated in FIG. 6C for providing the second seed layer 605 are similar to those illustrated in FIG. 5C, which are not described repeatedly for brevity.

Figure 6D:
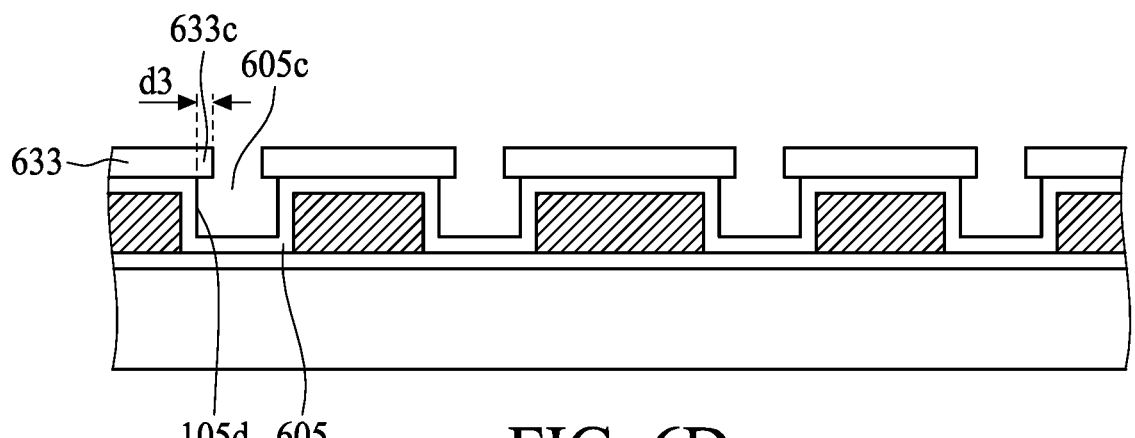

Referring to FIG. 6D, the processes illustrated in FIG. 6D for providing the first sacrificial layer 633 are similar to those illustrated in FIG. 5D, with a difference including that the first sacrificial layer 633 is formed as having a portion 633c protruding from the sidewall 105d of the opening 605c defined by the second seed layer 605 by a distance d3.

Figure 6E:
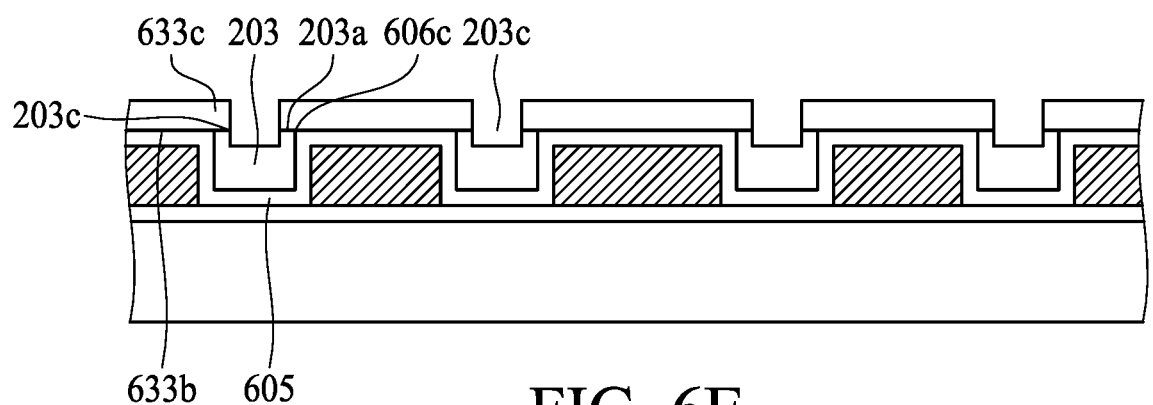
Figure 6F:
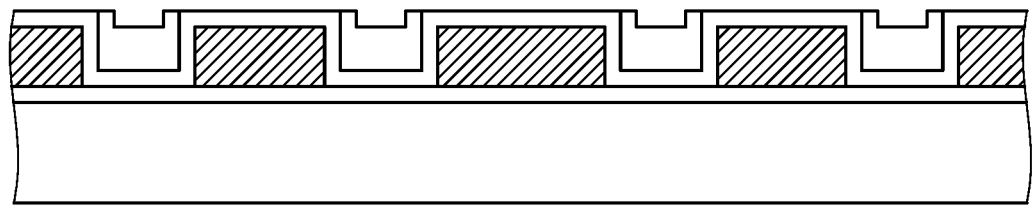
Figure 6G:
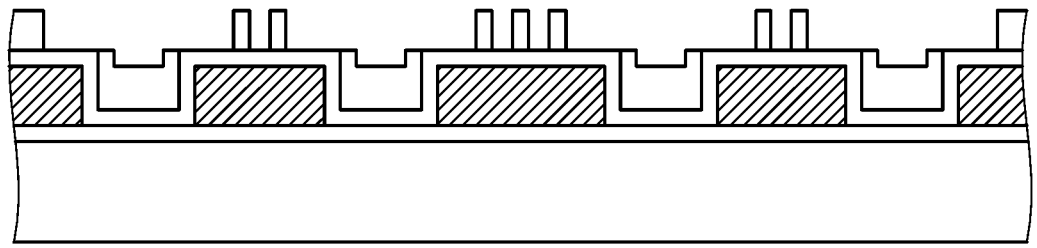
Figure 6H:
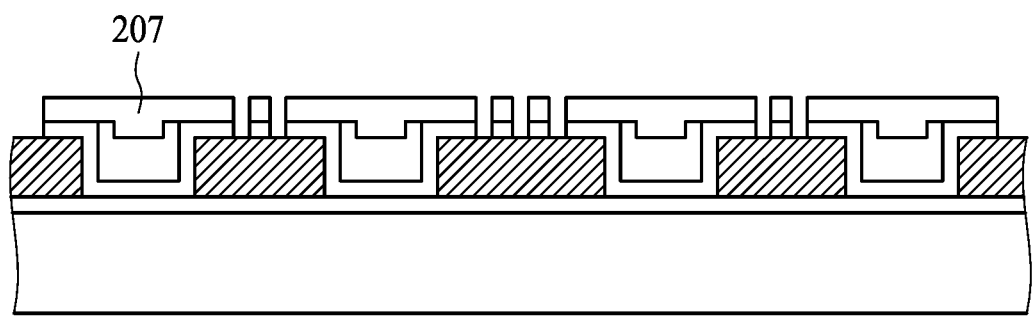
Figure 6I:
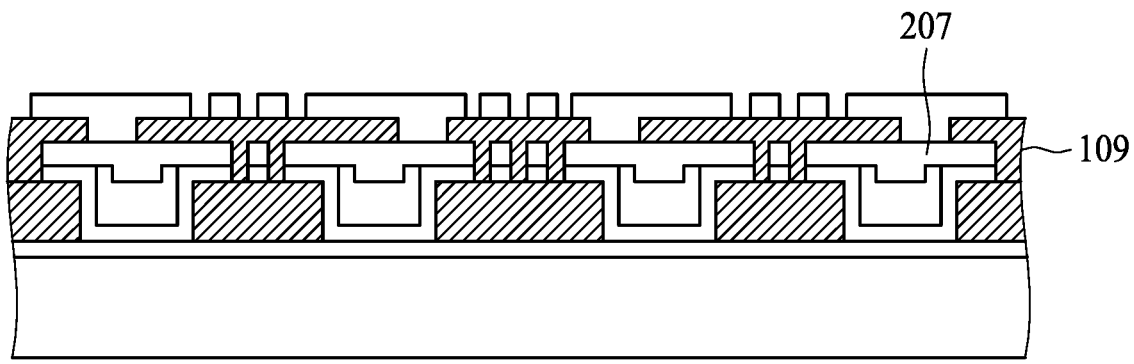
Figure 6J:
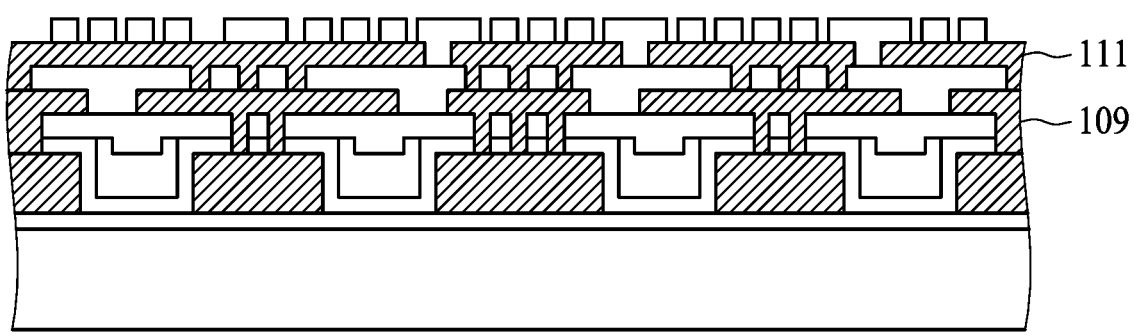
Figure 6K:
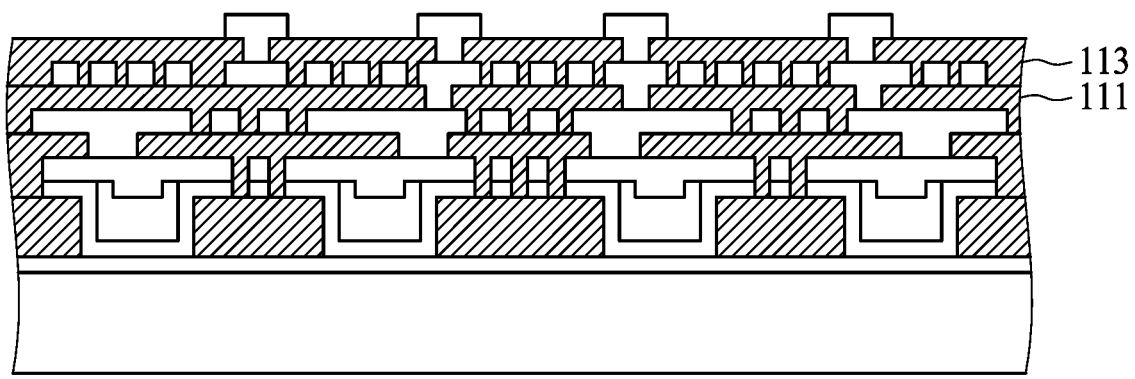
Figure 6L:
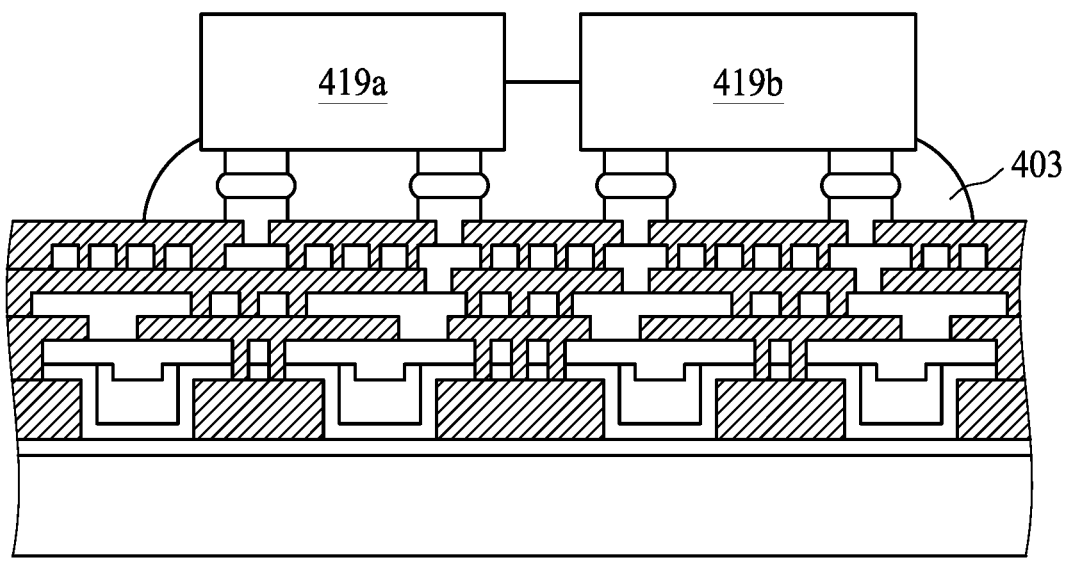
Figure 6M:
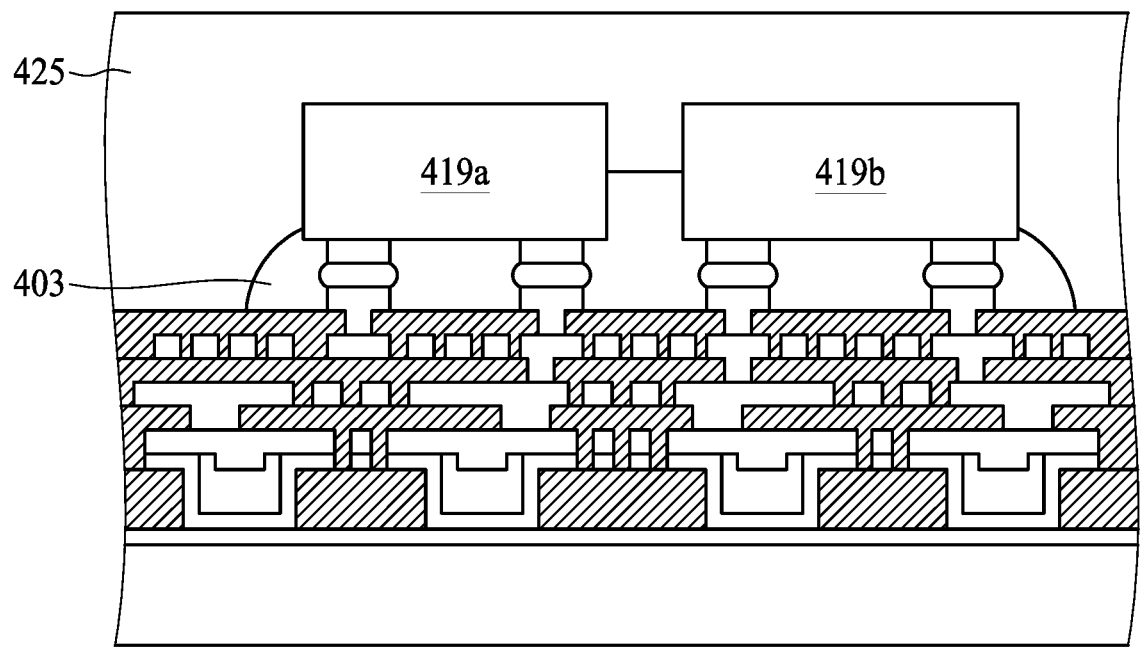
Figure 6N:
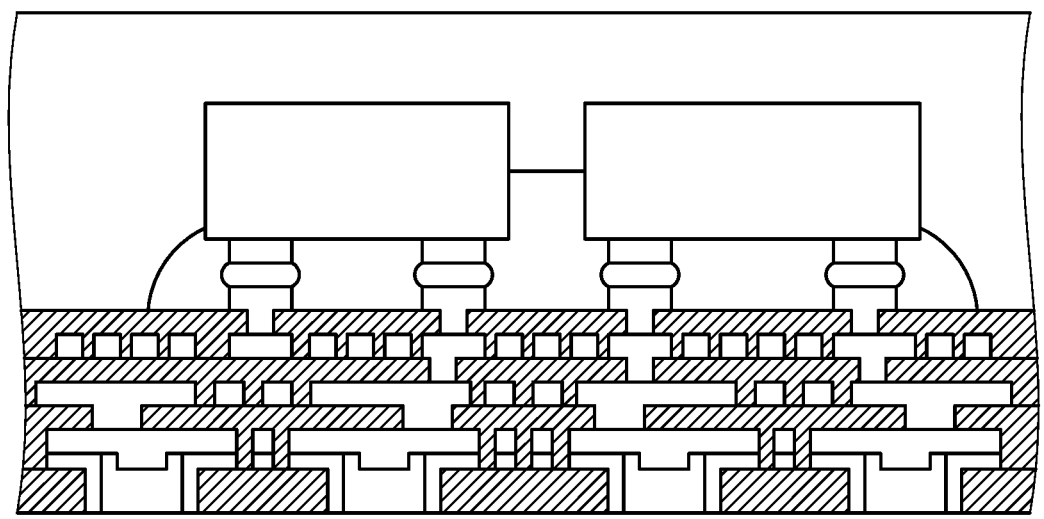
Figure 6O:
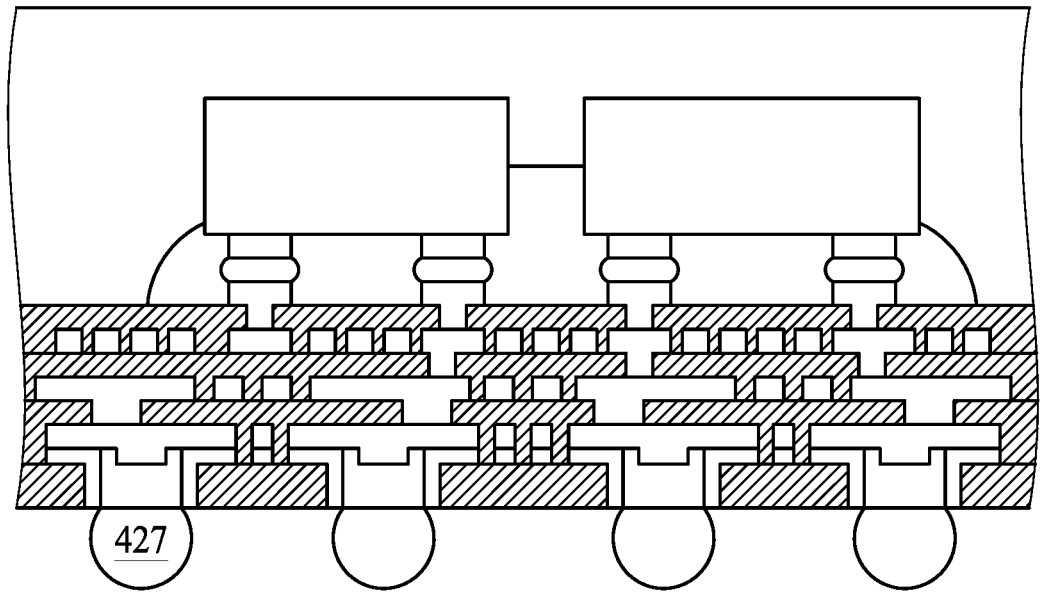

Referring to FIG. 6E, the processes illustrated in FIG. 6E for providing the bonding pad 203 are similar to that illustrated in FIG. 5E, with a difference including that the bonding pad 203 is disposed in conformity with the shape of the opening 606c defined by the second seed layer 605 and the protrusion portion 633c of the first sacrificial layer 633. Thus, the bonding pad 203 may have a portion of the first pad surface 203a below the bottom surface 633b of the first sacrificial layer 633. That is, the bonding pad 203 may have an indentation 203c indented from the first pad surface 203a of the bonding pad 203.

Referring to FIG. 6F-6O, the processes illustrated in FIG. 6F-6O for providing the conductive trace layer 207, the first RDL 109, the second RDL 111, the third RDL 113, the semiconductor element 419a, 419b, the underfill 403, the encapsulant 425, and the electrical connector 427 are similar to those illustrated in FIG. 5F-5O, which are not described repeatedly for brevity. After the processes illustrated in FIG. 6K, a semiconductor device package such as the one illustrated in FIG. 2 may be obtained. After the processes illustrated in FIG. 6O, a semiconductor device package such as the one illustrated in FIG. 4 may be obtained.

Figure 7A:
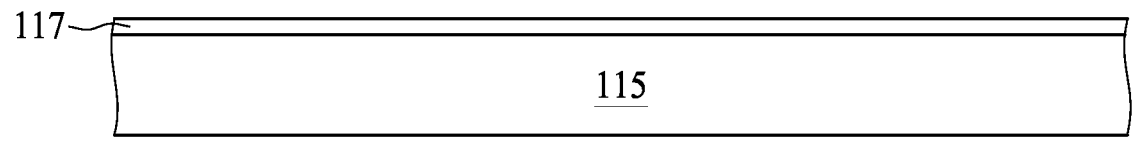
FIG. 7A, FIG. 7B, FIG. 7C, FIG. 7D, FIG. 7E, FIG. 7F, FIG. 7G, FIG. 7H, FIG. 7I, FIG. 7J, and FIG. 7K illustrate a method of manufacturing a semiconductor device package according to some embodiments of the present disclosure.

FIGS. 7A-7K illustrate a method of manufacturing a semiconductor device package according to some embodiments of the present disclosure. FIGS. 7A-7O illustrate a method of manufacturing a semiconductor device package according to some embodiments of the present disclosure.

Figure 7B:
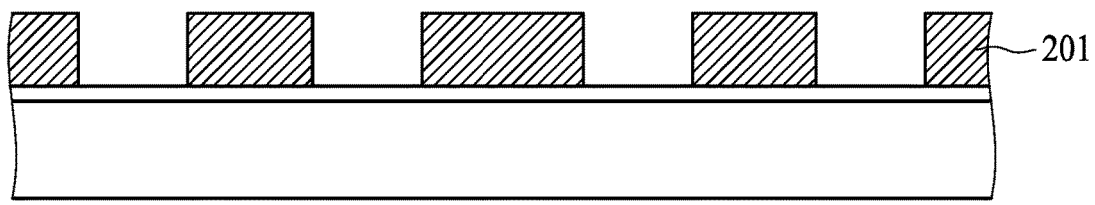
Figure 7C:
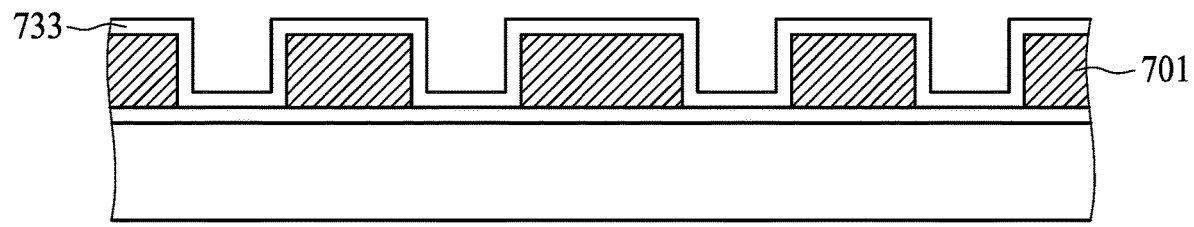

Referring to FIG. 7A-7C, the processes illustrated in FIG. 7A-7C for providing the carrier 115, the first seed layer 117, the first dielectric layer 201, and the metal layer 733 are similar to those illustrated in FIG. 6A-6C, which are not described repeatedly for brevity.

Figure 7D:
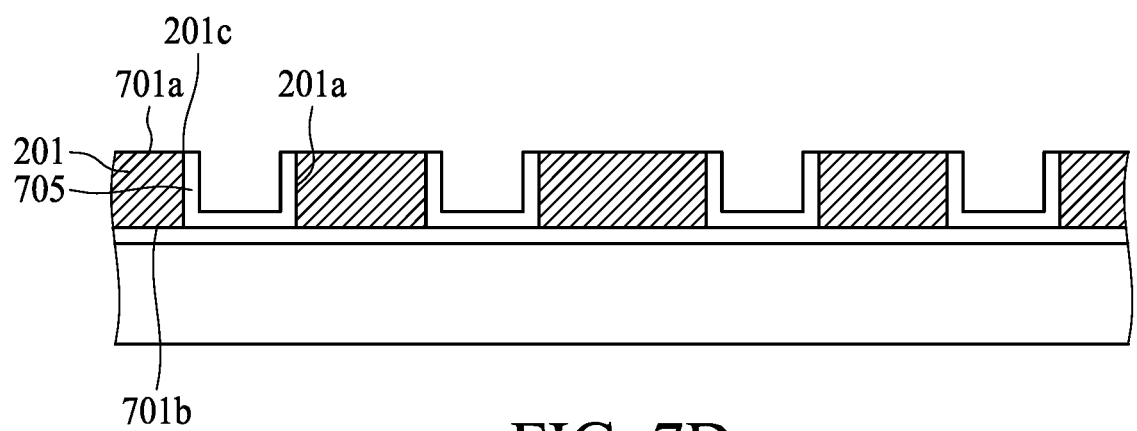

Referring to FIG. 7D, a portion of the metal layer 733 is removed so that there is no metal layer 733 on the first dielectric layer 701a of the dielectric layer 701 and a second seed layer 705 can be formed in conformity with the recess 201c defined by the dielectric layer 201. The removal of the metal layer 733 may be performed by a photolithography technique and an etching technique.

Figure 7E:
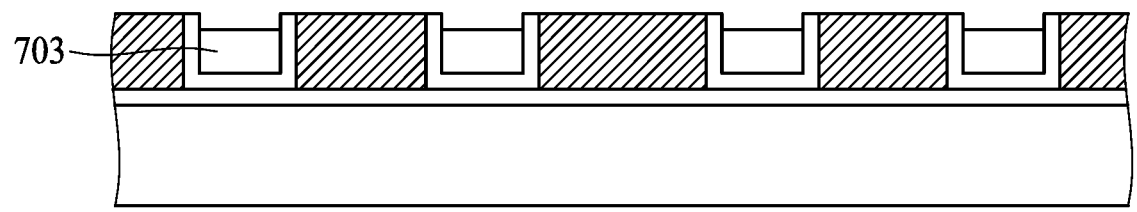

Referring to FIG. 7E, the processes illustrated in FIG. 7E for providing the bonding pad 703 are similar to those illustrated in FIG. 6E, which are not described repeatedly for brevity.

Figure 7F:
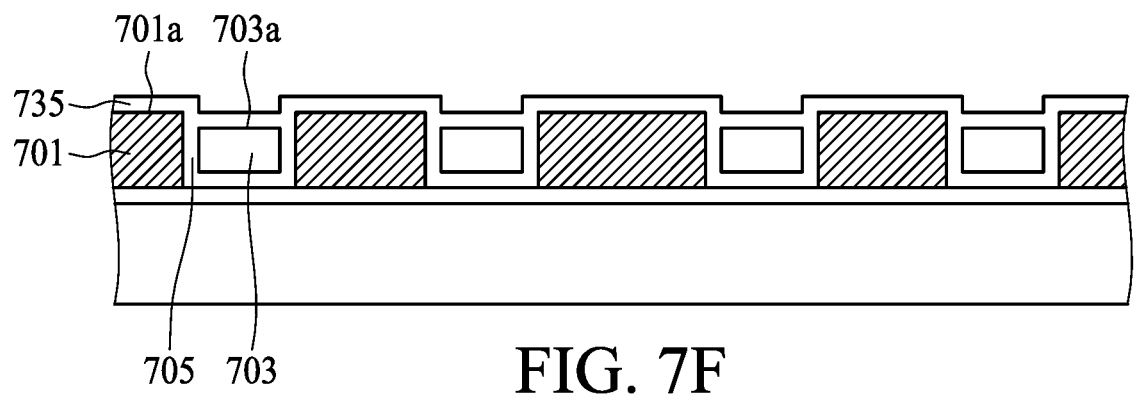

Referring to FIG. 7F, a third seed layer 735 is disposed on (e.g., physical contact or embedded in and exposed by) at least a portion of the first dielectric surface 701a of the dielectric layer 701, a portion of the second seed layer 705, and at least a portion of the first pad surface 703a of the bonding pad 703. The third seed layer 735 may be disposed by a plating technique, a physical vapor deposition technique, or other suitable process.

Figure 7G:
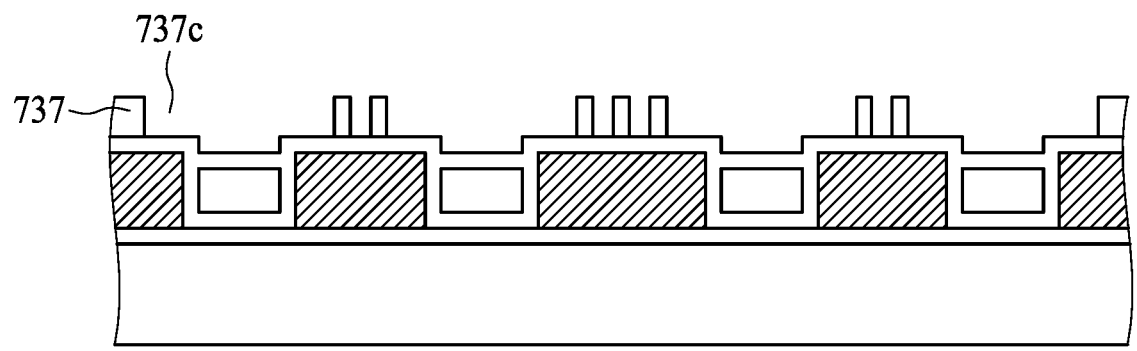
Figure 7H:
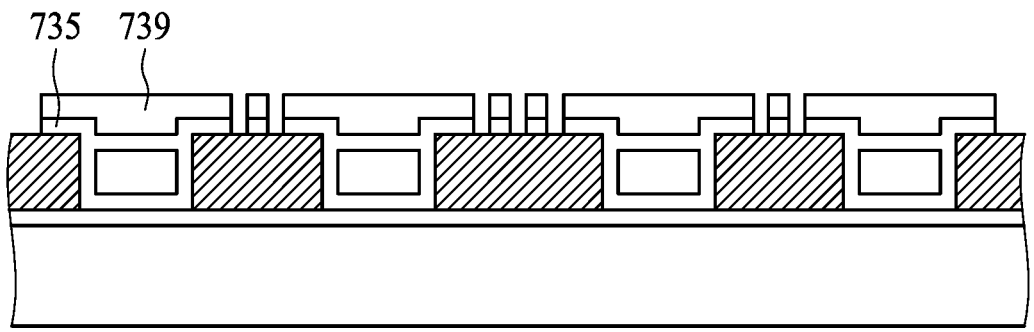
Figure 7I:
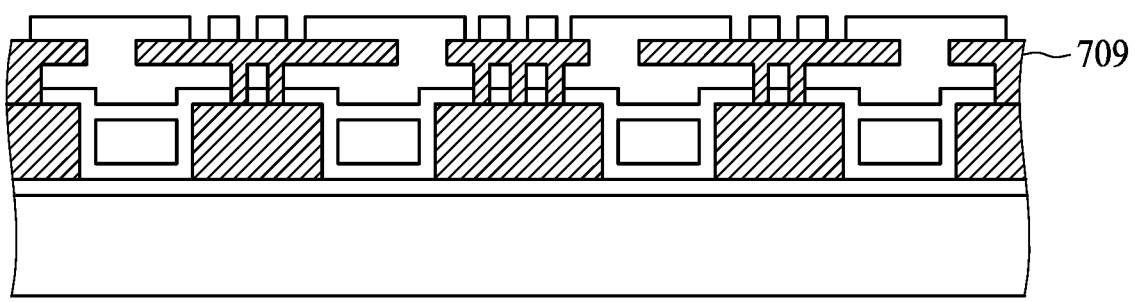
Figure 7J:
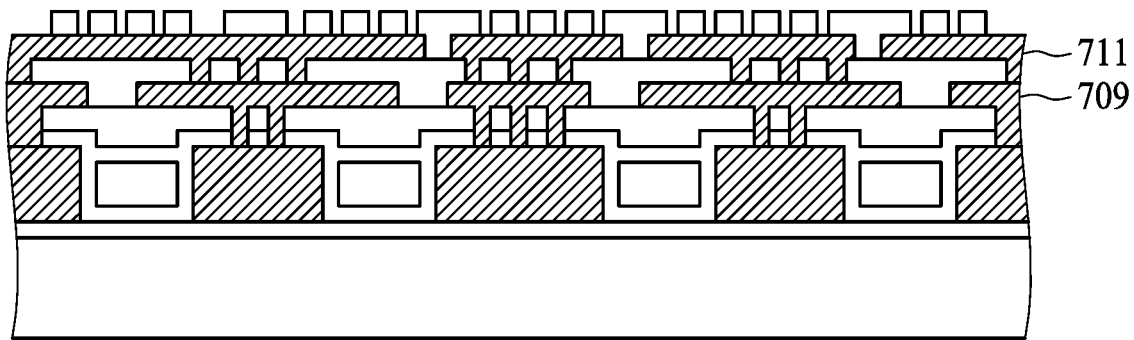
Figure 7K:
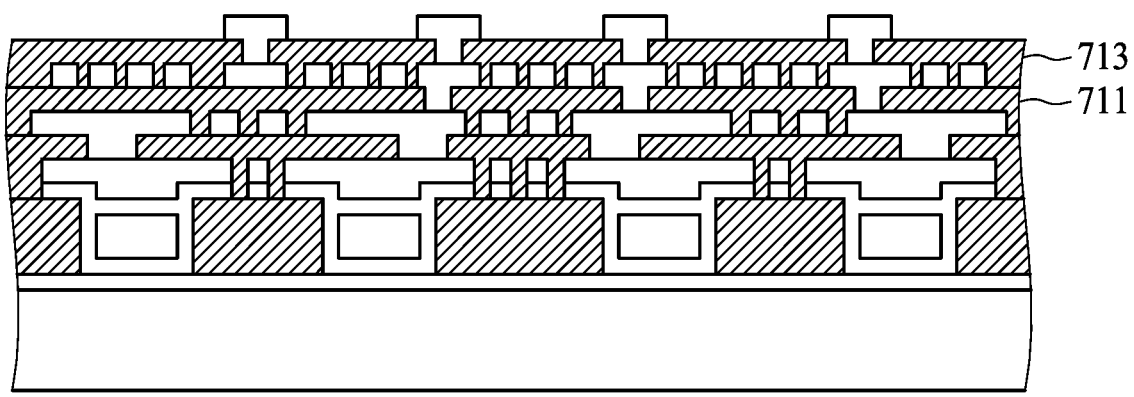
Figure 7L:
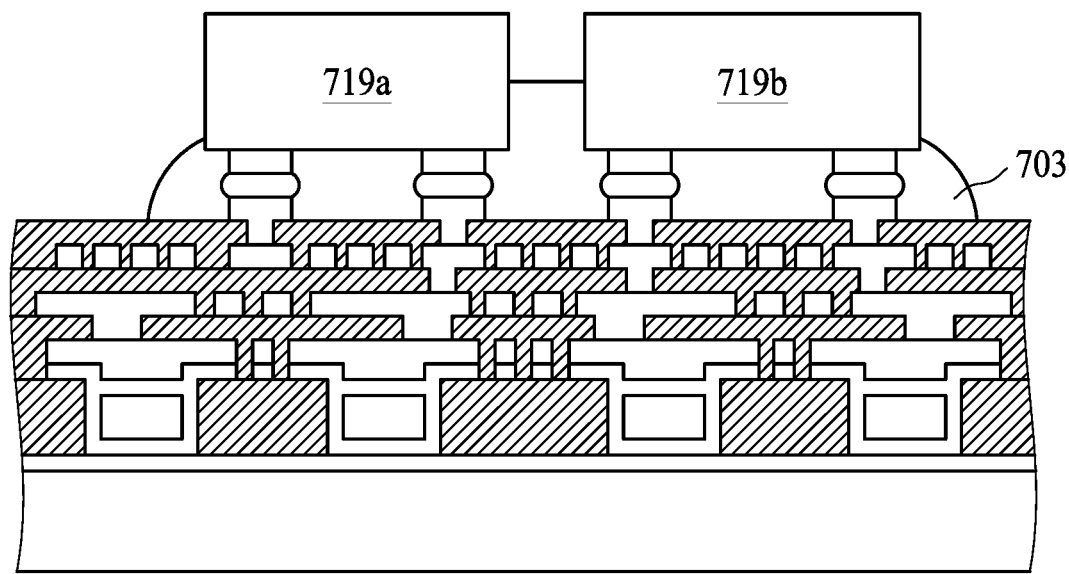
Figure 7M:
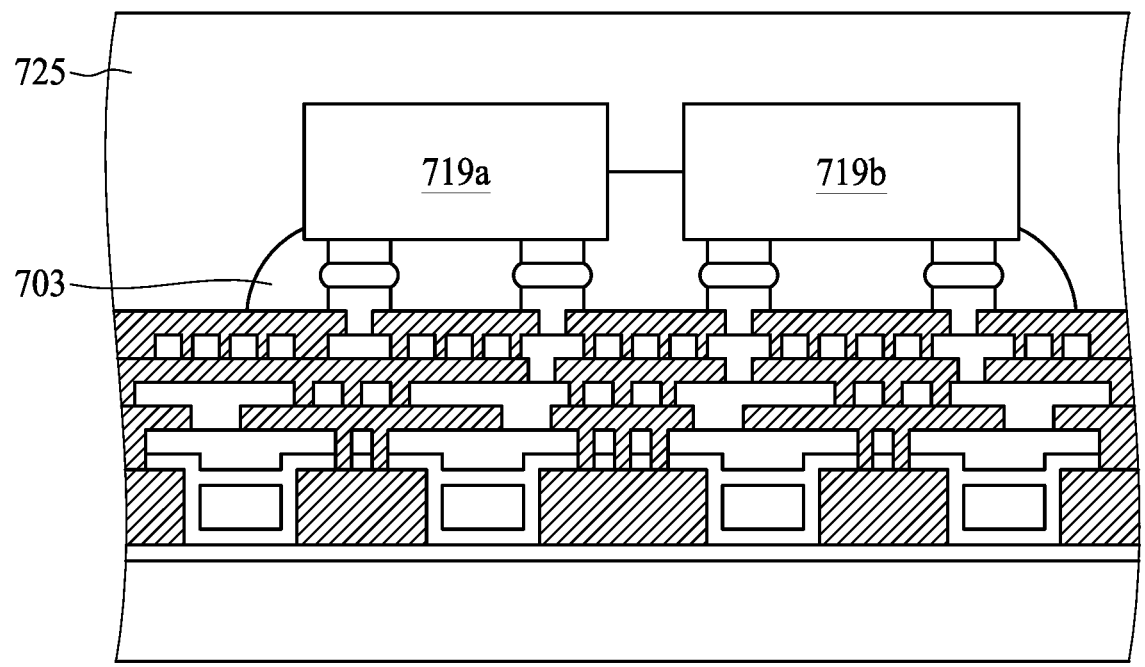
Figure 7N:
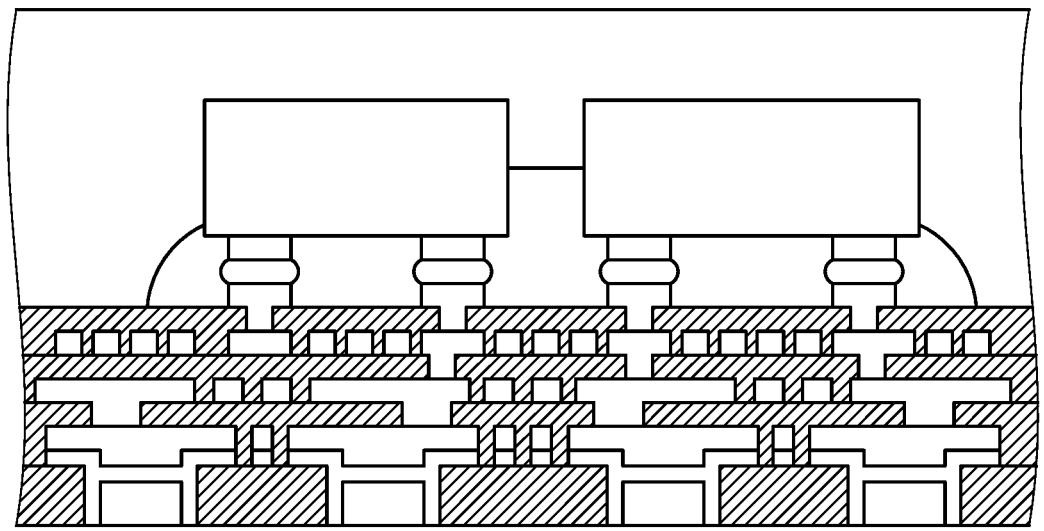
Figure 7O:
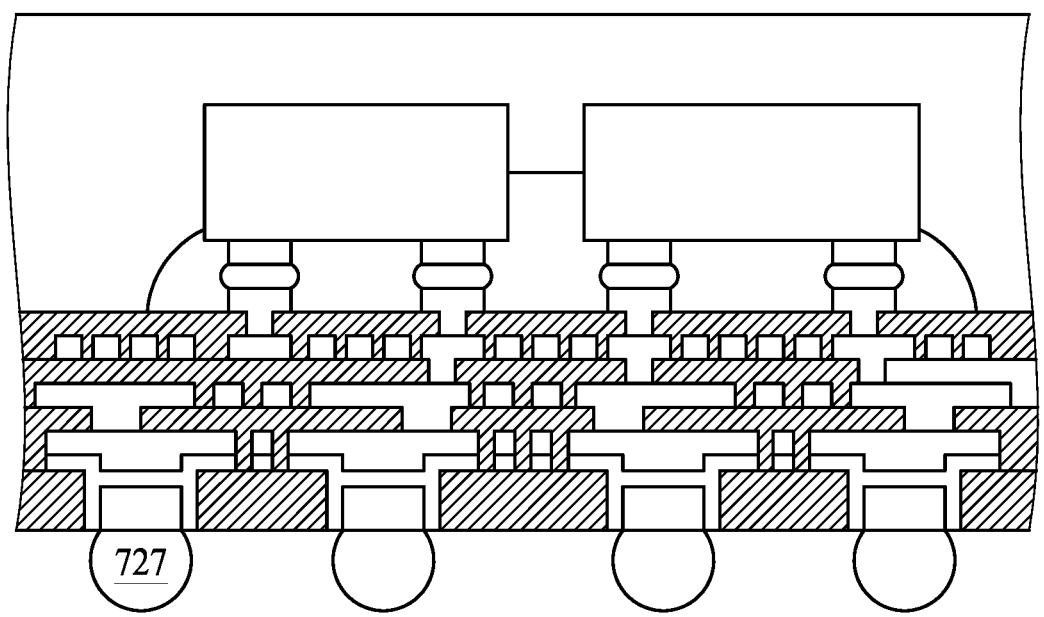

Referring to FIG. 7G-7O, the processes illustrated in FIG. 7G for providing the conductive trace layer 739, the first RDL 709, the second RDL 711, the third RDL 713, the semiconductor element 719a, 719b, the underfill 703, the encapsulant 725, and the electrical connector 727 are similar to those illustrated in FIG. 6G-6O, with a difference including that the conductive trace layer 739 is disposed on (e.g., physical contact or embedded in and exposed by) the third seed layer 735 and in conformity with the shape of the opening 737c defined by the second sacrificial layer 737. After the processes illustrated in FIG. 7K, a semiconductor device package may be obtained. After the processes illustrated in FIG. 7O, a semiconductor device package may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device package, comprising:
a circuit structure comprising:
a dielectric layer having a first dielectric surface and a second dielectric surface opposite to the first dielectric surface, wherein the dielectric layer defines a recess in the first dielectric surface, and the recess includes a sidewall;
a bonding pad disposed in the recess, wherein a first pad surface of the bonding pad is adjacent to the first dielectric surface, a second pad surface of the bonding pad is adjacent to the second dielectric surface, and an edge of the bonding pad is spaced from the sidewall of the recess by a first distance; and
a first seed layer disposed between the edge of the bonding pad and the sidewall of the recess, wherein the edge of the bonding pad is spaced from the first seed layer by a second distance.

2. The semiconductor device package of claim 1, wherein the first distance between the sidewall of the recess and the edge of the bonding pad becomes smaller from the first dielectric surface to the second dielectric surface.

3. The semiconductor device package of claim 1, wherein the second distance between the first seed layer and the edge of the bonding pad becomes smaller from the first dielectric surface to the second dielectric surface.

4. The semiconductor device package of claim 1, further comprising a conductive trace layer disposed on the first dielectric surface and the first pad surface of the bonding pad, and electrically connected to the bonding pad.

5. The semiconductor device package of claim 4, wherein the conductive trace layer further extends from the first dielectric surface toward the second dielectric surface and between the sidewall of the recess of the dielectric layer and the edge of the bonding pad.

6. The semiconductor device package of claim 4, wherein the conductive trace layer and the bonding pad are connected at a first interface.

7. The semiconductor device package of claim 4, wherein a height of the conductive trace layer is different from a height of the bonding pad.

8. The semiconductor device package of claim 7, wherein the height of the conductive trace layer is smaller than a height of the bonding pad.

9. The semiconductor device package of claim 1, wherein the sidewall of the recess inclines inwardly from the first dielectric surface toward the second dielectric surface.

10. The semiconductor device package of claim 1, wherein the first distance is larger than the second distance.

11. A semiconductor device package, comprising:
a circuit structure comprising:
a dielectric layer having a first dielectric surface and a second dielectric surface opposite to the first dielectric surface, wherein the dielectric layer defines a recess in the first dielectric surface;
a bonding pad disposed in the recess, wherein a first pad surface of the bonding pad is adjacent to the first dielectric surface, a second pad surface of the bonding pad is adjacent to the second dielectric surface, wherein the bonding pad includes an indentation; and
a conductive trace layer disposed on the first pad surface of the bonding pad, wherein the conductive trace layer fills in the indentation and engaged with the first pad surface of the bonding pad.

12. The semiconductor device package of claim 11, wherein the indentation of the bonding pad locates at approximately a center of the first pad surface of the bonding pad.

13. The semiconductor device package of claim 11, further comprising a seed layer disposed between an edge of the bonding pad and a sidewall of the recess of the dielectric layer.

14. The semiconductor device package of claim 13, wherein the seed layer extends from the first dielectric surface toward the second dielectric surface and between the sidewall of the recess of the dielectric layer and the edge of the bonding pad.

15. The semiconductor device package of claim 13, wherein a portion of the first pad surface of the bonding pad is in substantially the same plane with a top surface of the seed layer.

16. The semiconductor device package of claim 11, wherein the recess include a sidewall substantially perpendicular to the first dielectric surface.

17. The semiconductor device package of claim 11, wherein the conductive trace layer forms an interface with the first pad surface of the bonding pad.

\* \* \* \* \*